(12) United States Patent
Ishikawa et al.

(10) Patent No.: US 11,013,104 B2
(45) Date of Patent: May 18, 2021

(54) POWER CONVERSION APPARATUS

(71) Applicant: Panasonic Intellectual Property Management Co., Ltd., Osaka (JP)

(72) Inventors: Ryo Ishikawa, Kanagawa (JP); Atsushi Ichinose, Kanagawa (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 16/598,670

(22) Filed: Oct. 10, 2019

(65) Prior Publication Data

US 2020/0120789 A1    Apr. 16, 2020

(30) Foreign Application Priority Data

Oct. 12, 2018    (JP) .............................. JP2018-193049

(51) Int. Cl.
| | |
|---|---|
| *H05K 1/02* | (2006.01) |
| *H05K 7/20* | (2006.01) |
| *H02M 3/00* | (2006.01) |
| *H02M 7/00* | (2006.01) |
| *H02P 27/06* | (2006.01) |
| *B60L 15/00* | (2006.01) |

(52) U.S. Cl.
CPC .......... *H05K 1/0209* (2013.01); *B60L 15/007* (2013.01); *H02M 3/00* (2013.01); *H02M 7/003* (2013.01); *H02P 27/06* (2013.01); *H05K 7/2089* (2013.01); *B60L 2210/10* (2013.01); *B60L 2210/40* (2013.01); *H05K 2201/06* (2013.01)

(58) Field of Classification Search
CPC ..................................................... H05K 1/0209
See application file for complete search history.

(56) References Cited

U.S. PATENT DOCUMENTS

2013/0187453 A1\* 7/2013 Flett ...................... H02M 7/003
307/23
2018/0168075 A1\* 6/2018 Okazaki ............. H05K 7/20272

FOREIGN PATENT DOCUMENTS

JP    2016-220344 A    12/2001

\* cited by examiner

*Primary Examiner* — Mukundbhai G Patel
(74) *Attorney, Agent, or Firm* — Seed IP Law Group LLP

(57) ABSTRACT

Provided is a power conversion apparatus including: a plurality of power converters including a first power converter and a second power converter simultaneously operated by power supplied via a first connector; and a heat dissipation board having a first pattern formed thereon for distributing the power supplied via the first connector to the first power converter and the second power converter.

5 Claims, 22 Drawing Sheets

POWER CONVERSION APPARATUS

TECHNICAL FIELD

The present disclosure relates to a power conversion apparatus.

BACKGROUND ART

Recently, integration of devices is being advanced for in-vehicle power conversion apparatuses in order to extend the cruising distance. With a conventional technique, devices such as a charger, an inverter, and a DC/DC converter are integrated.

CITATION LIST

Patent Literature

PTL 1: JP 2016-220344 A

SUMMARY OF INVENTION

Technical Problem

In the conventional technique, the power is distributed to a plurality of power converters by using bus bars. When the bus bars are used for distributing the power to a plurality of power converters, the sectional area of the bus bars needs to be expanded in consideration of the heat generated in the bus bars due to large electric current, which leads to an increase in the size of the power conversion apparatus.

An object of the present disclosure is to provide a power conversion apparatus that can be reduced in size.

Solution to Problem

One aspect of the present disclosure is a power conversion apparatus including: a plurality of power converters including a first power converter and a second power converter which operate simultaneously by power supplied via a first connector; and a heat dissipation board having a first pattern formed thereon, the first pattern being shared by a power line supplying the power from the first connector to the first power converter and a power line supplying the power from the first connector to the second power converter.

Advantageous Effects of Invention

With the present disclosure, it is possible to reduce the size of the power conversion apparatus.

DESCRIPTION OF EMBODIMENT

Hereinafter, a power supply apparatus (an example of "power conversion apparatus") according to an embodiment of the present disclosure will be described in detail with reference to the accompanying drawings. Note that embodiments described hereinafter are examples, and the present disclosure is not limited by the embodiments.

(Entire Configuration of Power Supply Apparatus)

Figure 1:
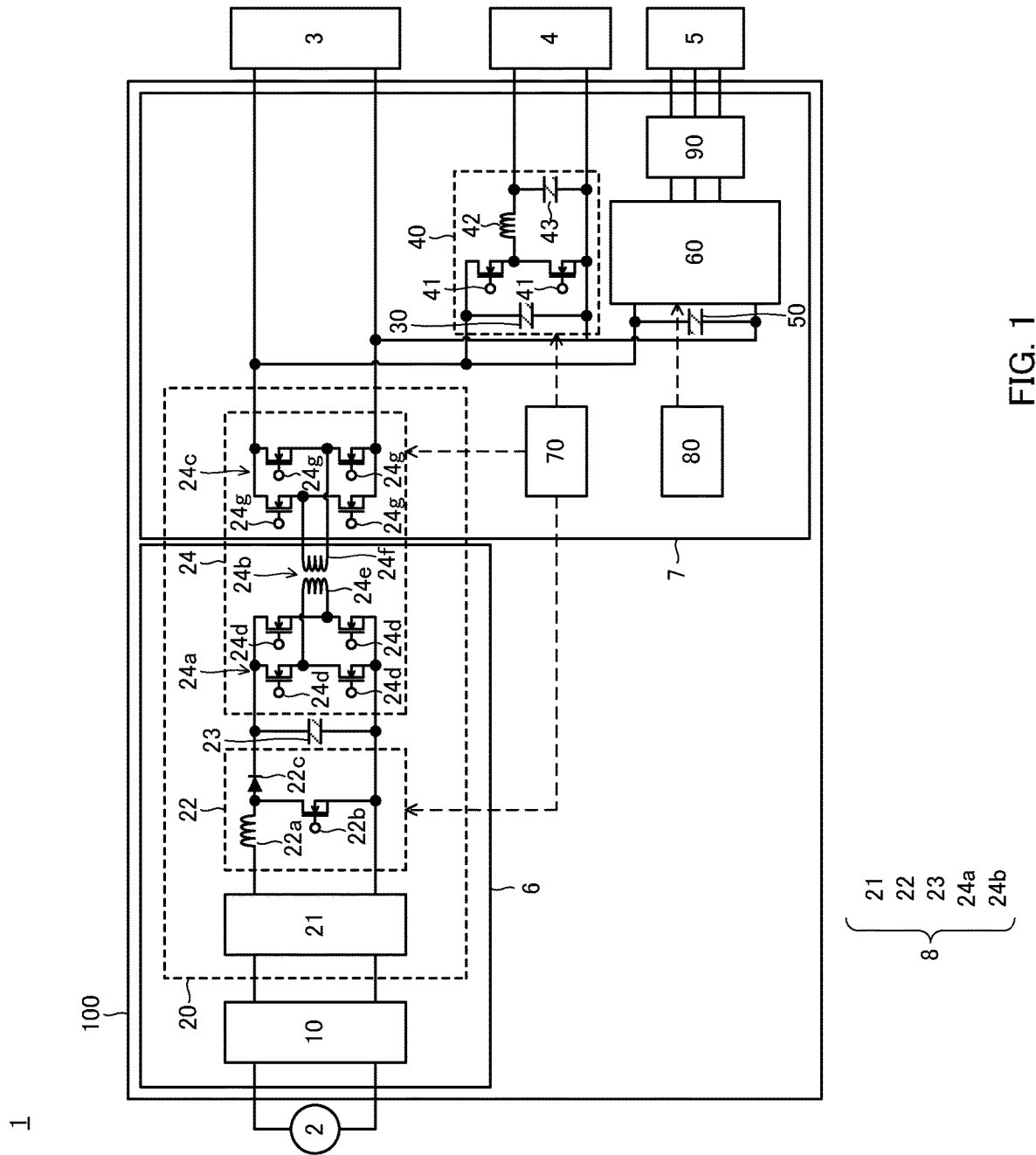
FIG. 1 is a circuit block diagram illustrating a configuration of a power supply apparatus according to an embodiment.

The entire configuration of power supply apparatus 1 will be described with reference to FIG. 1. FIG. 1 is a circuit block diagram illustrating the configuration of power supply apparatus 1.

Power supply apparatus 1 is installed on vehicles such as electric vehicles. Power supply apparatus 1 charges battery 3 with the power supplied from an external power supply 2, and supplies the power from the battery 3 to at least one of load 4 and motor 5.

Battery 3 is a low-voltage (for example, 48 V) rated battery that requires no insulation for the bodies of vehicles. An example of battery 3 may be a lithium ion battery. Load 4 is an electronic device driven at a low voltage (for example, 12 V). Motor 5 is a three-phase AC motor driven at a low voltage (for example, 48 V). Motor 5 is a driving motor for running a vehicle.

Power supply apparatus 1 includes AC filter section 10, charger 20, DC/DC converter 40, capacitor 50, power converter 60, first controller 70, and second controller 80. AC filter section 10, charger 20, DC/DC converter 40, capacitor 50, power converter 60, first controller 70, and second controller 80 are housed inside housing 100 that is connected to a body of a vehicle where power supply apparatus 1 is installed.

AC filter section 10 decreases noise entering from external power supply 2 and noise leaking to external power supply 2. AC filter section 10 includes a coil, a capacitor, and the like.

Charger 20 converts power of a first voltage (for example, 100 V) supplied from external power supply 2 that is an AC power supply to power of a second voltage (for example, 48 V) that is lower than the first voltage, and outputs to battery 3. Charger 20 includes rectifier 21, power factor corrector 22, capacitor 23, and DC/DC converter 24.

Rectifier 21 performs full-wave rectification on AC power from AC filter section 10 to convert to DC power, and outputs to power factor corrector 22. Rectifier 21 is a diode bridge circuit made up of four diodes.

Power factor corrector 22 has a function of correcting the power factor of the power from rectifier 21. Power factor corrector 22 includes coil 22a, switching element 22b, and diode 22c. Although not illustrated FIG. 1, power supply apparatus 1 includes two power factor correctors 22 connected in parallel between rectifier 21 and capacitor 23. In this way, power factor correctors 22 configure an interleave-type power factor correction circuit.

Capacitor 23 is connected to an output side of power factor corrector 22, and smoothens the DC power from power factor corrector 22. The voltage of the DC power is boosted up by power factor corrector 22, so that capacitor 23 comes to have a relatively large capacitance.

DC/DC converter 24 is a circuit that converts the DC power from power factor corrector 22 to voltage that can be charged to battery 3. DC/DC converter 24 includes inverter 24a, transformer 24b, and secondary-side rectifier circuit 24c.

Inverter 24a converts the DC power from power factor corrector 22 to the AC power, and outputs to transformer 24b. Inverter 24a includes four switching elements 24d.

Transformer 24b transforms the voltage of the AC power from inverter 24a, and outputs to secondary-side rectifier circuit 24c. Transformer 24b includes power transmission coil 24e connected to an output side of inverter 24a and power reception coil 24f connected to an input side of secondary-side rectifier circuit 24c.

Secondary-side rectifier circuit 24c is a circuit that converts the AC power from transformer 24b to the DC power. Secondary-side rectifier circuit 24c includes four switching elements 24g.

DC/DC converter 40 converts the DC power of the second voltage (for example, 48 V) output from battery 3 to a third voltage (for example, 12 V) that can be supplied to load 4. DC/DC converter 40 includes capacitor 30 disposed on the input side, two switching elements 41, coil 42, and capacitor 43 disposed on the output side.

Capacitor 50 is disposed on an input side of power converter 60. Functions of capacitor 50 will be described later.

Power converter 60 converts the DC power of the second voltage to the AC power. Power converter 60 is a three-phase bridge inverter circuit, and includes a plurality of switching elements. Current sensor 90 is provided on the output side of power converter 60.

First controller 70 controls operations of charger 20 by on-off controlling switching element 22b of power factor corrector 22, switching elements 24d of inverter 24a, and switching elements 24g of secondary-side rectifier circuit 24c. In other words, under control of first controller 70, the AC power of the first voltage supplied from external power supply 2 is converted to the DC power of the second voltage via charger 20 and charged to battery 3.

Further, first controller 70 controls operations of DC/DC converter 40 by on-off controlling switching element 41 of DC/DC converter 40. In other words, under control of first controller 70, the DC power of the second voltage is converted to the DC power of the third voltage via DC/DC converter 40 and output to load 4.

Second controller 80 controls operations of power converter 60 by on-off controlling the switching element of power converter 60. In other words, under control of second controller 80, the DC power of the second voltage supplied from battery 3 is converted to three-phase AC power of the second voltage via power converter 60 and output to motor 5.

First controller 70 and second controller 80 are communicable with a vehicle control apparatus via a connector provided to housing 100, and perform control of each component of power supply apparatus 1 under control of the vehicle control apparatus. Note that first controller 70 and second controller 80 operate at a low voltage, so that insulation for the car body is unnecessary.

(Configuration of Power Supply Apparatus)

Figure 2:
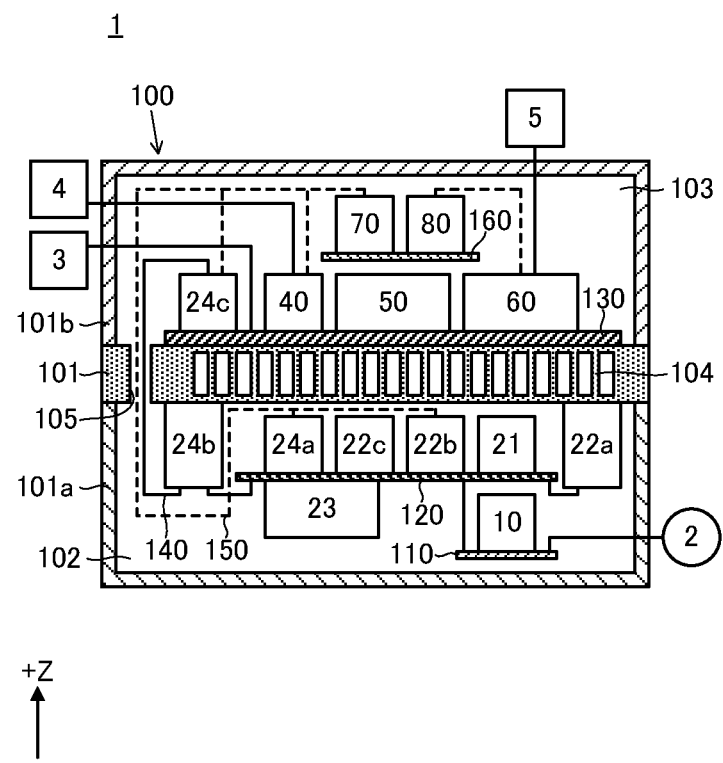
FIG. 2 is a diagram illustrating a configuration of the power supply apparatus according to the embodiment.

Next, the configuration of power supply apparatus 1 will be described with reference to FIG. 2. FIG. 2 is a diagram illustrating the configuration of power supply apparatus 1. Note that FIG. 2 schematically illustrates the configuration of power supply apparatus 1, and a part of components and wiring not directly related to explanations thereof is omitted. In FIG. 2, Z-axis is drawn for the sake of convenience. Positive direction of the Z-axis (upper direction in FIG. 2) is defined as +Z direction.

Power supply apparatus 1 includes housing 100. Housing 100 includes: partition member 101 extended on a plane (hereinafter, referred to as "XY plane") orthogonal to the Z-axis; first cover member 101a provided on −Z-direction side of partition member 101; and second cover member 101b provided on +Z-direction side of partition member 101.

In the embodiment, partition member 101, first cover member 101a, and second cover member 101b are all aluminum members. First cover member 101a has an opening on the +Z-direction side. Second cover member 101b has an opening on the −Z-direction side. First cover member 101a and second cover member 101b are fixed (for example, fastened via screw) to partition member 101.

AC filter section 10, rectifier 21, power factor corrector 22 (coil 22a, switching element 22b, and diode 22c), capacitor 23, inverter 24a, and transformer 24b in charger 20 are provided within first space 102 that is surrounded by partition member 101 and first cover member 101a.

AC filter section 10, rectifier 21, power factor corrector 22, capacitor 23, inverter 24a, and transformer 24b in charger 20 are where the first voltage is applied. Hereinafter, the part where the first voltage is applied may be referred to as "first circuit part 6" (see FIG. 1). Further, rectifier 21, power factor corrector 22, capacitor 23, inverter 24a, and transformer 24b in charger 20 may also be referred to as "primary-side circuit 8" (see FIG. 1).

Each element constituting AC filter section 10 is mounted on the +Z-side surface of AC filter board 110 extended on the XY plane. AC filter board 110 is a resin board.

Each element constituting rectifier 21, switching element 22b as well as diode 22c of power factor corrector 22, and inverter 24a are mounted on the +Z-side surface of high-voltage board 120 extended on the XY plane. Capacitor 23 is mounted on the −Z-side surface of high-voltage board 120. High-voltage board 120 is a resin board. AC filter board 110 and high-voltage board 120 are electrically connected.

High-voltage board 120 is disposed on the −Z-direction side of partition member 101 with a gap provided with respect to partition member 101. Further, AC filter board 110 is disposed on the −Z-direction side of high-voltage board 120 with a gap provided with respect to high-voltage board 120.

Coil 22a of power factor corrector 22 is disposed with a prescribed gap provided with respect to the −Z-side surface of partition member 101. High-voltage board 120 and coil 22a are electrically connected. Transformer 24b is disposed with a prescribed gap provided with respect to the −Z-side surface of partition member 101. High-voltage board 120 and transformer 24b are electrically connected.

Secondary-side rectifier circuit 24c of charger 20, DC/DC converter 40, capacitor 50, power converter 60, first controller 70, and second controller 80 are provided within second space 103 that is surrounded by partition member 101 and second cover member 101b.

Secondary-side rectifier circuit 24c of charger 20, DC/DC converter 40, capacitor 50, power converter 60, first controller 70, and second controller 80 are where the second voltage is applied. Hereinafter, the part where the second voltage is applied may also be referred to as "second circuit part 7" (see FIG. 1).

The insulation class in first space 102 and the insulation class in second space 103 are different from each other. Specifically, the insulation class in first space 102 is higher than the insulation class in second space 103.

Each element constituting secondary-side rectifier circuit 24c of charger 20, DC/DC converter 40, capacitor 50, and power converter 60 is mounted on the +Z-side surface of low-voltage board 130. Low-voltage board 130 is an aluminum board, and a resin insulation layer is coated on the +Z-side surface of low-voltage board 130.

Further, on the surface of the insulation layer, a wiring pattern electrically connecting each of the elements is printed. The wiring pattern formed on low-voltage board 130 will be described later. Note that −Z-side surface of low-voltage board 130 is directly in contact with the +Z-side surface of partition member 101. This makes it possible to appropriately cool the elements on the low-voltage side where a large current flows.

Heat dissipation fin 104 is provided to partition member 101. Further, hole 105 opened through the Z-direction is provided to partition member 101. First circuit part 6 and second circuit part 7 are electrically connected via power line 140 provided through hole 105. Specifically, transformer 24b and secondary-side rectifier circuit 24c are electrically connected via power line 140 provided through hole 105.

Each element constituting first controller 70 and each element constituting second controller 80 are mounted on the +Z-side surface of control board 160 extended on the XY plane. Control board 160 is a resin board. Control board 160 is disposed with a gap provided with respect to low-voltage board 130 on the +Z-direction side of low-voltage board 130.

First controller 70, switching element 22b, and inverter 24a are electrically connected via signal line 150 provided through hole 105.

As described above, in the embodiment, primary-side circuit 8 of charger 20 where the first voltage is applied is stored within first space 102, and secondary-side rectifier circuit 24c of charger 20 where the second voltage lower than the first voltage is applied is stored within second space 103.

Further, in the embodiment, first circuit part 6 where the first voltage is applied is stored in first space 102, and second circuit part 7 where the second voltage lower than the first voltage is applied is stored within second space 103.

In this way, the elements on the high-voltage side requiring high insulation property can be collectively disposed within first space 102, and the elements on the low-voltage side requiring high heat dissipation property can be collectively disposed within second space 103.

With the embodiment, the insulation structure and the heat dissipation structure can be formed as appropriate structures through appropriately disposing each element depending on necessity of insulation and necessity of heat dissipation, thereby making it possible to reduce the size of power supply apparatus 1.

Further, in the embodiment, first controller 70 that controls primary-side circuit 8 is stored within second space 103. Therefore, it is possible to preferably suppress excessive insulation of the elements constituting first controller 70.

Further, in the embodiment, the highly heat-dissipative low-voltage side elements with a large current flowing therein are collectively mounted on aluminum low-voltage board 130 that is excellent in the heat dissipation property. Therefore, those elements can be cooled appropriately.

Further, low-voltage board 130 is disposed to be directly in contact with partition member 101 that includes heat dissipation fin 104 and is excellent in the heat dissipation property. Therefore, the highly heat-dissipative low-voltage side elements with a large current flowing therein can be cooled more appropriately.

Furthermore, in the embodiment, the high-voltage side elements are collectively disposed within first space 102 and the low-voltage side elements are collectively disposed within second space 103, so that it is possible to preferably suppress the influence of the noise generated on the high-voltage side imposed upon the low-voltage side.

Especially, in the embodiment, power supply apparatus 1 includes partition member 101 that sections first space 102 and second space 103, and partition member 101 includes heat dissipation fin 104. In this way, the distance between first space 102 on the high-voltage side and second space 103 on the low-voltage side can be isolated.

Therefore, it is possible to preferably suppress the influence of the noise generated on the high-voltage side imposed upon the low-voltage side. Further, impedance can be increased by partition member 101 and heat dissipation fin 104, so that it is possible to more preferably suppress the influence of the noise generated on the high-voltage side imposed upon the low-voltage side.

(Distribution Structure in Low-Voltage Board)

Figure 3A:
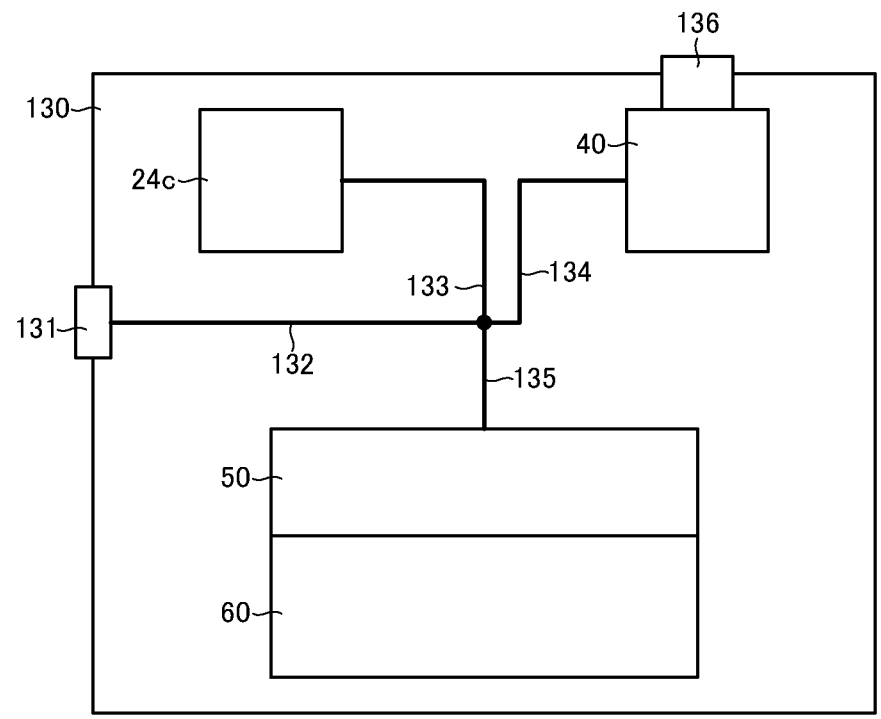
FIG. 3A is a diagram illustrating a configuration of a low-voltage board according to the embodiment.
Figure 3A:
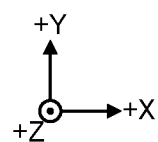
Figure 3B:
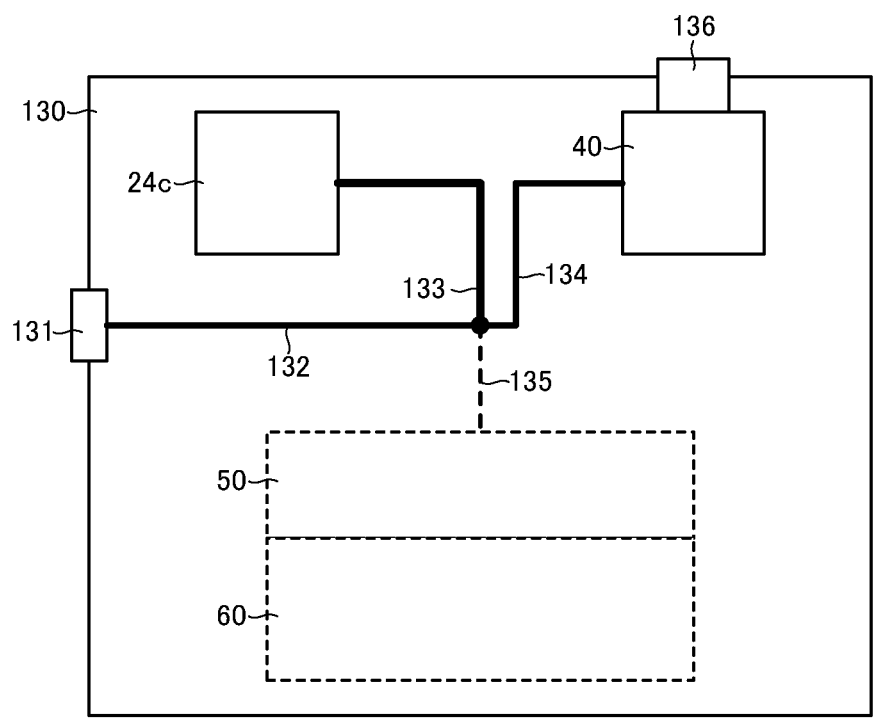
FIG. 3B is a diagram illustrating a configuration of the low-voltage board according to the embodiment.
Figure 3C:
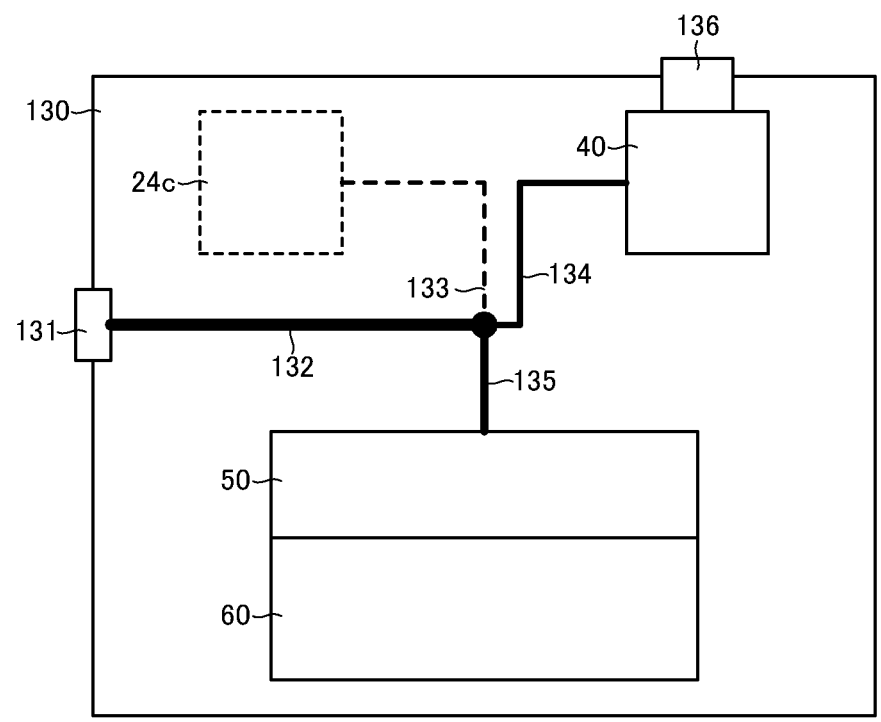
FIG. 3C is a diagram illustrating a configuration of the low-voltage board according to the embodiment.

Next, a wiring pattern (distribution structure) on low-voltage board 130 will be described with reference to FIG. 3A, FIG. 3B, and FIG. 3C. FIG. 3A, FIG. 3B, and FIG. 3C are diagrams illustrating a configuration of the low-voltage board 130. X-axis, Y-axis, and Z-axis are drawn in FIG. 3A, FIG. 3B, and FIG. 3C for the sake of convenience. The Z-axis is in common to the Z-axis of FIG. 2. The positive direction of the X-axis is defined as +X-direction, and the positive direction of the Y-axis is defined as +Y-direction. Note that components not directly related to explanations are omitted in FIG. 3A, FIG. 3B, and FIG. 3C.

As described above, low-voltage board 130 is a metal board such as an aluminum board or a copper board. Low-voltage board 130 is directly placed and fixed on the +Z-side surface of partition member 101 (see FIG. 2). An insulation layer made of resin is coated on +Z-side surface of low-voltage board 130.

Each element of secondary-side rectifier circuit 24c, each element of DC/DC converter 40, capacitor 50, and each element of power converter 60 are mounted on the +Z-side surface of low-voltage board 130.

Connector 131 used for outputting the power to battery 3 and for inputting the power from battery 3 is provided at an end portion of low-voltage board 130 in the −X-direction. Connector 131 is a connector shared by DC/DC converter 40 and power converter 60.

Secondary-side rectifier circuit 24c of charger 20 is provided on the +Y-direction side of connector 131 and on a side closer to an edge of the end portion of low-voltage board 130 in the −X-direction. DC/DC converter 40 is provided on the +X-direction side of secondary-side rectifier circuit 24c and on a side closer to an edge of the end portion of low-voltage board 130 in the +Y-direction. Capacitor 50 and power converter 60 are provided on the −Y-direction side of connector 131.

Connector 131 and secondary-side rectifier circuit 24c, DC/DC converter 40, and power converter 60 are electrically connected by the wiring pattern printed on the surface of the insulation layer of low-voltage board 130.

Wiring pattern 132 is extended in the +X-direction from connector 131. In other words, a first end portion of wiring pattern 132 is connected to connector 131. Wiring pattern 133, wiring pattern 134, and wiring pattern 135 are branched from a second end portion of wiring pattern 132.

Wiring pattern 133 is connected to secondary-side rectifier circuit 24c. In other words, a first end portion of wiring pattern 133 is connected to the second end portion of wiring pattern 132, and a second end portion of wiring pattern 133 is connected to output side of secondary-side rectifier circuit 24c. Note that power line 140 (see FIG. 2) electrically connecting input side of secondary-side rectifier circuit 24c with transformer 24b is extended in the +Z-direction from secondary-side rectifier circuit 24c.

Wiring pattern 134 is connected to DC/DC converter 40. In other words, a first end portion of wiring pattern 134 is connected to the second end portion of wiring pattern 132, and a second end portion of wiring pattern 134 is connected to the input side of DC/DC converter 40. Note that connector 136 outputting the power from DC/DC converter 40 to load 4 is provided at an end portion of low-voltage board 130 in the +Y-direction.

Wiring pattern 135 is connected to power converter 60 via capacitor 50. In other words, a first end portion of wiring pattern 135 is connected to the second end portion of wiring pattern 132, and a second end portion of wiring pattern 135 is connected to the input side of power converter 60. Note that the power line outputting the power from power converter 60 to motor 5 is extended in the +Z-direction from power converter 60.

FIG. 3B illustrates an operation state where the power from external power supply 2 is charged to battery 3 and the power from external power supply 2 is supplied to load 4. Electric current A1 [A] output from secondary-side rectifier circuit 24c of charger 20 is flown in wiring pattern 133. Electric current A2 [A] input to DC/DC converter 40 is flown in wiring pattern 134. Electric current acquired by subtracting the electric current input to DC/DC converter 40 from the electric current output from secondary-side rectifier circuit 24c of charger 20 is flown in wiring pattern 132. In other words, the electric current (A1−A2) [A] is flown in wiring pattern 132.

FIG. 3C illustrates an operation state where the power from battery 3 is supplied to load 4 and motor 5. Electric current A2 [A] input to DC/DC converter 40 is flown in wiring pattern 134. Electric current A3 [A] input to power converter 60 is flown in wiring pattern 135. Electric current acquired by adding the electric current input to DC/DC converter 40 and the electric current input to power converter 60 is flown in wiring pattern 132.

In other words, in the operation state where the power from battery 3 is supplied to load 4 and motor 5, large electric current (A2+A3) [A] is to be flown in wiring pattern 132. Therefore, the heating value particularly in wiring pattern 132 is high.

In the embodiment, wiring patterns 132, 133, 134, and 135 are all provided on aluminum low-voltage board 130. Therefore, even when large electric current flows in wiring pattern 132 and the heating value in wiring pattern 132 is high, it is possible to appropriately cool wiring pattern 132.

Further, in the embodiment, secondary-side rectifier circuit 24c, DC/DC converter 40, capacitor 50, and power converter 60 are also provided on low-voltage board 130. Therefore, it is possible to appropriately cool secondary-side rectifier circuit 24c, DC/DC converter 40, capacitor 50, and power converter 60.

Especially, secondary-side rectifier circuit 24c, DC/DC converter 40, capacitor 50, and power converter 60 are included in low-voltage side second circuit part 7, so that the heating value at the time of operation is high. With the embodiment, when DC/DC converter 40 and power converter 60 operate simultaneously, for example, it is possible to appropriately dissipate the heat generated in wiring pattern 132, wiring pattern 134, wiring pattern 135, DC/DC converter 40, capacitor 50, and power converter 60 from low-voltage board 130.

As described above, in the embodiment, wiring patterns 132, 134, and 135 distributing the power supplied via connector 131 to DC/DC converter 40 and power converter 60 are formed on aluminum low-voltage board 130 exhibiting high heat dissipation performance.

Therefore, even when DC/DC converter 40 and power converter 60 operate simultaneously, it is possible to appropriately dissipate the heat generated in wiring pattern 132, wiring pattern 134, and wiring pattern 135 from low-voltage board 130.

While the case of mounting secondary-side rectifier circuit 24c, DC/DC converter 40, capacitor 50, and power converter 60 on low-voltage board 130 is described in the embodiment above, the distribution structure is not limited to such case. Hereinafter, a variation of the distribution structure will be described.

(Variation of Distribution Structure in Low-Voltage Board)

Figure 3D:
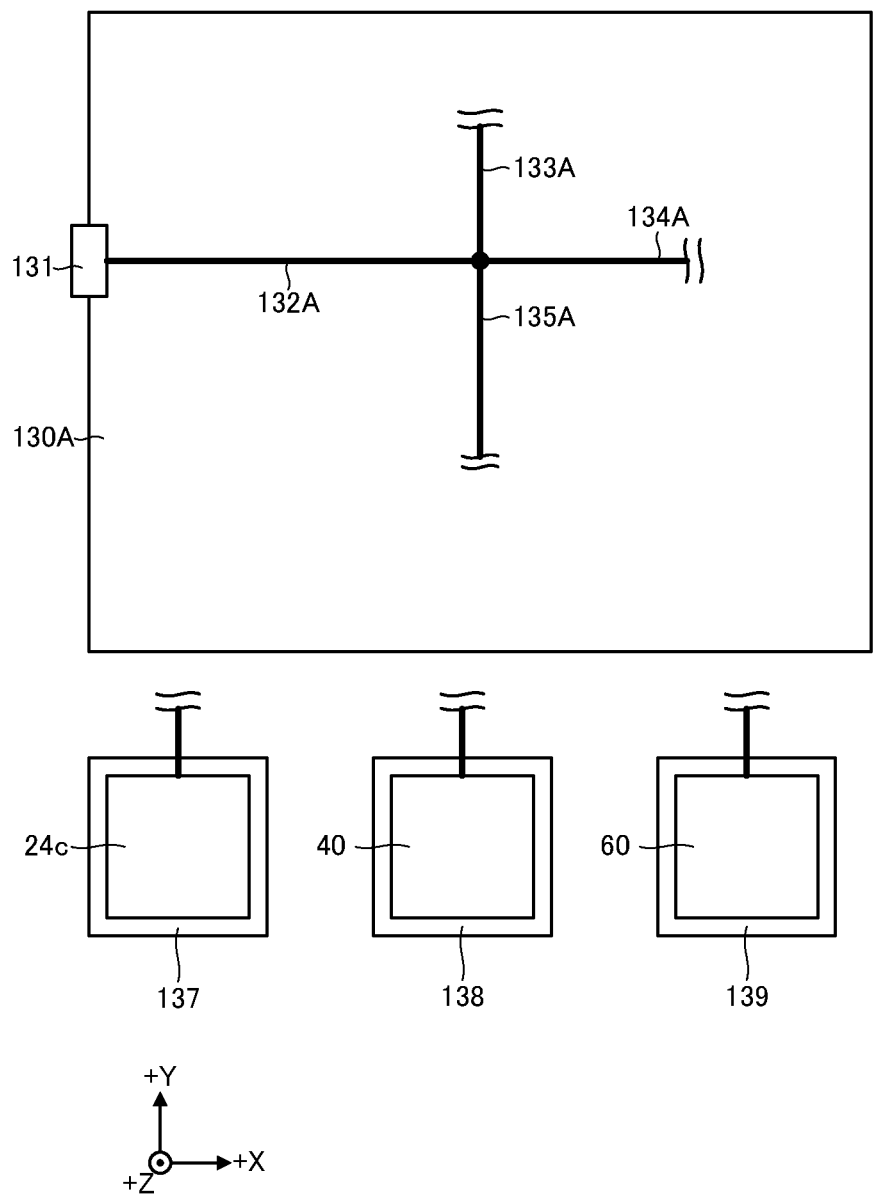
FIG. 3D is a diagram illustrating a configuration of a low-voltage board according to a variation.

A variation of the distribution structure will be described in detail with reference to FIG. 3D. FIG. 3D is a diagram illustrating a wiring structure of low-voltage board 130A according to the variation. In FIG. 3D, X-axis, Y-axis, and Z-axis are drawn for the sake of convenience. The X-axis, the Y-axis, and the Z-axis are common to those drawn in FIG. 3A to FIG. 3C.

The variation is different from the above-described Embodiment in that secondary-side rectifier circuit 24c, DC/DC converter 40, and power converter 60 are not mounted on low-voltage board 130A. The same components as those of the above-described Embodiment are denoted by the same reference signs, and technical terms and functions thereof are also the same. Therefore, detailed explanations thereof are omitted.

Low-voltage board 130A is an aluminum board, for example. Low-voltage board 130A is directly placed and fixed on the +Z-side surface of partition member 101 (see FIG. 2). The +Z-side surface of low-voltage board 130A is coated with an insulation layer.

Secondary-side rectifier circuit 24c of charger 20 is mounted on first board 137 that is different from low-voltage board 130A. DC/DC converter 40 is mounted on second board 138 that is different from low-voltage board 130A. Power converter 60 is mounted on third board 139 that is different from low-voltage board 130A.

Connector 131 is provided at an end portion of low-voltage board 130A in the −X-direction. Wiring pattern 132A is extended in the +Y-direction from connector 131. In other words, a first end portion of wiring pattern 132A is connected to connector 131. Wiring pattern 133A, wiring pattern 134A, and wiring pattern 135A are branched from a second end portion of wiring pattern 132A.

In other words, wiring pattern 132A, wiring pattern 133A, wiring pattern 134A, and wiring pattern 135A are all provided on low-voltage board 130A.

Wiring pattern 133A is electrically connected to secondary-side rectifier circuit 24c mounted on first board 137. Note that the power line that electrically connects low-voltage board 130A and first board 137 may be wiring exhibiting flexibility or may be a rigid body such as a bus bar.

Wiring pattern 134A is electrically connected to DC/DC converter 40 mounted on second board 138. Note that the power line that electrically connects low-voltage board 130A and second board 138 may be wiring exhibiting flexibility or may be a rigid body such as a bus bar.

Wiring pattern 135A is electrically connected to power converter 60 mounted on third board 139. Note that the power line that electrically connects low-voltage board 130A and third board 139 may be wiring exhibiting flexibility or may be a rigid body such as a bus bar.

As described above, in the variation, wiring pattern 132A is formed on aluminum low-voltage board 130A that exhibits high heat dissipation performance. Therefore, even when a large electric current is flown in wiring pattern 132A and the heating value generated in wiring pattern 132A is large, wiring pattern 132A can be cooled appropriately.

While the case of mounting each of secondary-side rectifier circuit 24c, DC/DC converter 40, and power converter 60 on respective boards is described above in the variation, the configuration is not limited to such case. For example, DC/DC converter 40 and power converter 60 may be mounted on a common board or power converter 60 that has a large heating value may be mounted on the low-voltage board.

(Distribution Structure in Control Board)

Figure 3E:
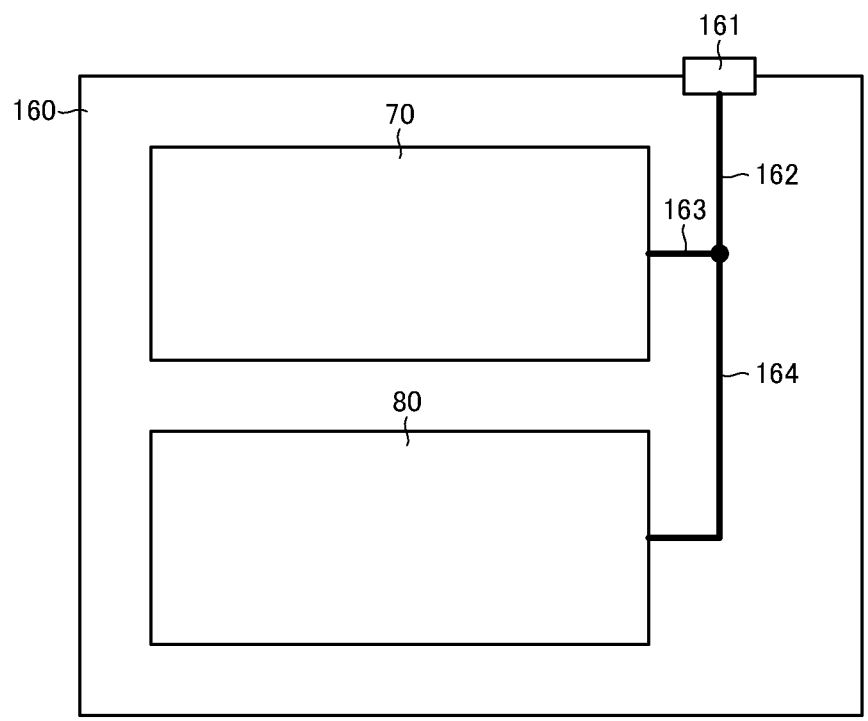
FIG. 3E is a diagram illustrating a configuration of a control board according to the variation.

Wiring patterns (distribution structure) in control board 160 will be described with reference to FIG. 3E. FIG. 3E is a diagram illustrating the configuration of control board 160. In FIG. 3E, X-axis, Y-axis, and Z-axis are drawn for the sake of convenience. The X-axis, the Y-axis, and the Z-axis are common to those drawn in FIG. 3A to FIG. 3D. Note that components not directly related to explanations are omitted in FIG. 3E.

As described above, control board 160 is a resin board. Each element of first controller 70 and each element of second controller 80 are mounted on the +Z-side surface of control board 160. Connector 161 used for inputting the power and control signals from outside is provided at an end portion of control board 160 in the +Y-direction. Connector 161 is a connector used in common by first controller 70 and second controller 80.

First controller 70 is provided on a side closer to the end portion of control board 160 in the +Y-direction. Second controller 80 is provided on a side closer to the end portion of control board 160 in the −Y-direction. Connector 161, first controller 70, and second controller 80 are electrically connected via the wiring patterns printed on the surface of control board 160.

Wiring pattern 162 is extended in the −Y-direction from connector 161. In other words, a first end portion of wiring pattern 162 is connected to connector 161. Wiring pattern 163 and wiring pattern 164 are branched from a second portion of wiring pattern 162.

Wiring pattern 163 is connected to first controller 70. In other words, a first end portion of wiring pattern 163 is connected to a second end portion of wiring pattern 162, and a second end portion of wiring pattern 163 is connected to first controller 70.

Wiring pattern 164 is connected to second controller 80. In other words, a first end portion of wiring pattern 164 is connected to the second end portion of wiring pattern 162, and a second end portion of wiring pattern 164 is connected to second controller 80.

Electric current A4 [A] input to first controller 70 is flown in wiring pattern 163. Electric current A5 [A] input to second controller 80 is flown in wiring pattern 164. In other words, electric current (A4+A5) [A] is to be flown in wiring pattern 162.

In the embodiment, the power from outside is supplied to first controller 70 and second controller 80 via wiring pattern 162 as well as wiring pattern 163 and wiring pattern 164 branched from wiring pattern 162 provided on control board 160.

Therefore, it is unnecessary to perform routing of the wiring within the housing, so that the size of power supply apparatus 1 can be reduced.

(Transformer and Peripheral Configurations Thereof)

Transformer 24b and peripheral configurations thereof will be described with reference to FIG. 4A, FIG. 4B, FIG. 4C, FIG. 4D, and FIG. 4E. In FIG. 4A to FIG. 4E, X-axis, Y-axis, and Z-axis are drawn for the sake of convenience. The X-axis, the Y-axis, and the Z-axis are common to those drawn in FIG. 3A to FIG. 3E. Note that components not directly related to explanations are omitted in FIG. 4A to FIG. 4E.

Figure 4A:
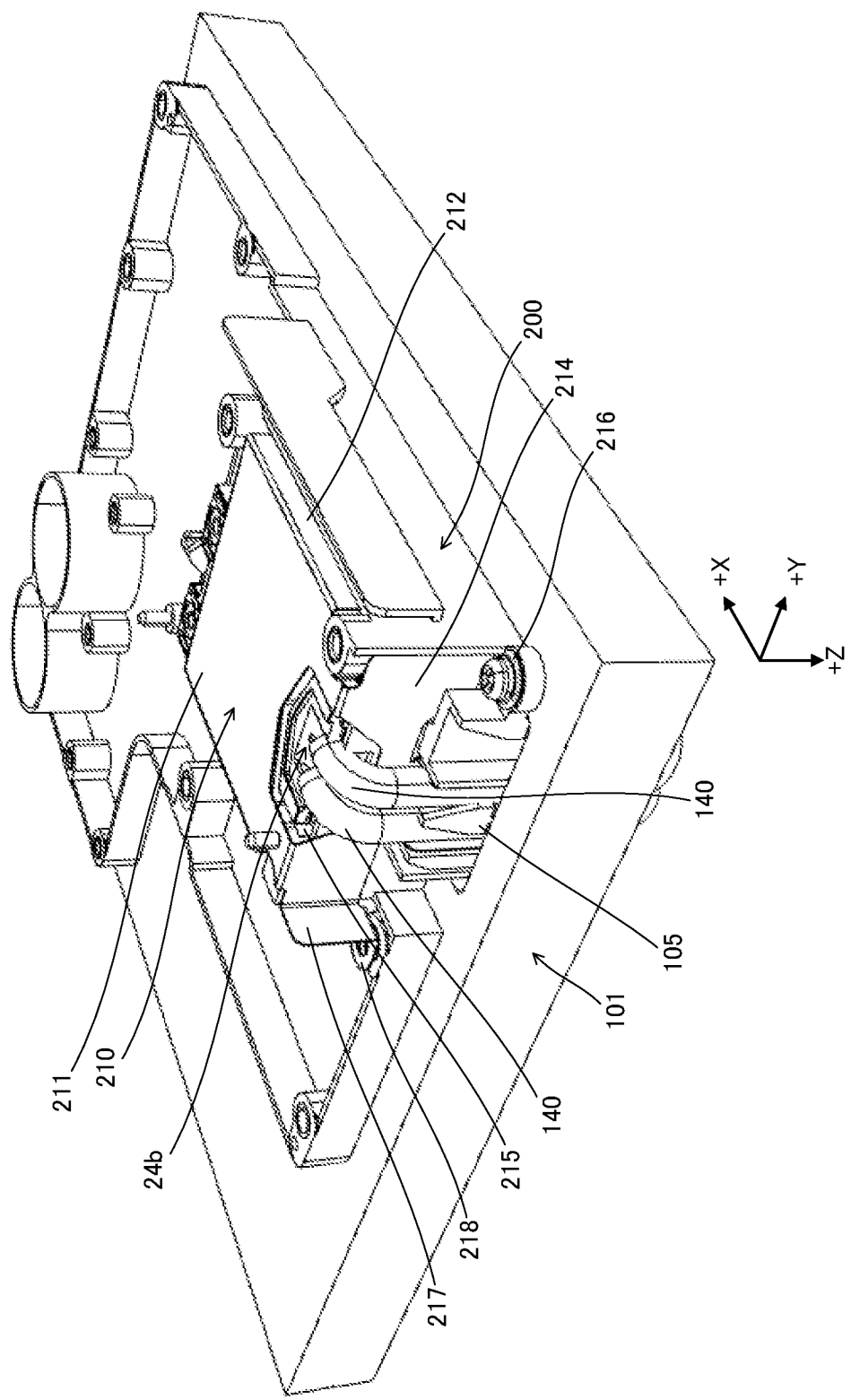
FIG. 4A is a perspective view illustrating a transformer according to the embodiment and peripheral configurations thereof.

FIG. 4A is a perspective view illustrating transformer 24b and peripheral configurations thereof. As illustrated in FIG. 4A, resin transformer case 200 formed integrally with a pedestal of high-voltage board 120 (see FIG. 2) is provided on the −Z-side surface of partition member 101. Both of the end portions of transformer case 200 in the −Z-direction and the +Z-direction are opened. The end portion of transformer case 200 in +Z-direction is fixed by being bonded to partition member 101. In this way, box-shaped transformer case 200 having partition member 101 being the bottom face and only the top face (face in −Z-direction) being opened is created. Transformer 24b is stored inside transformer case 200.

Figure 4B:
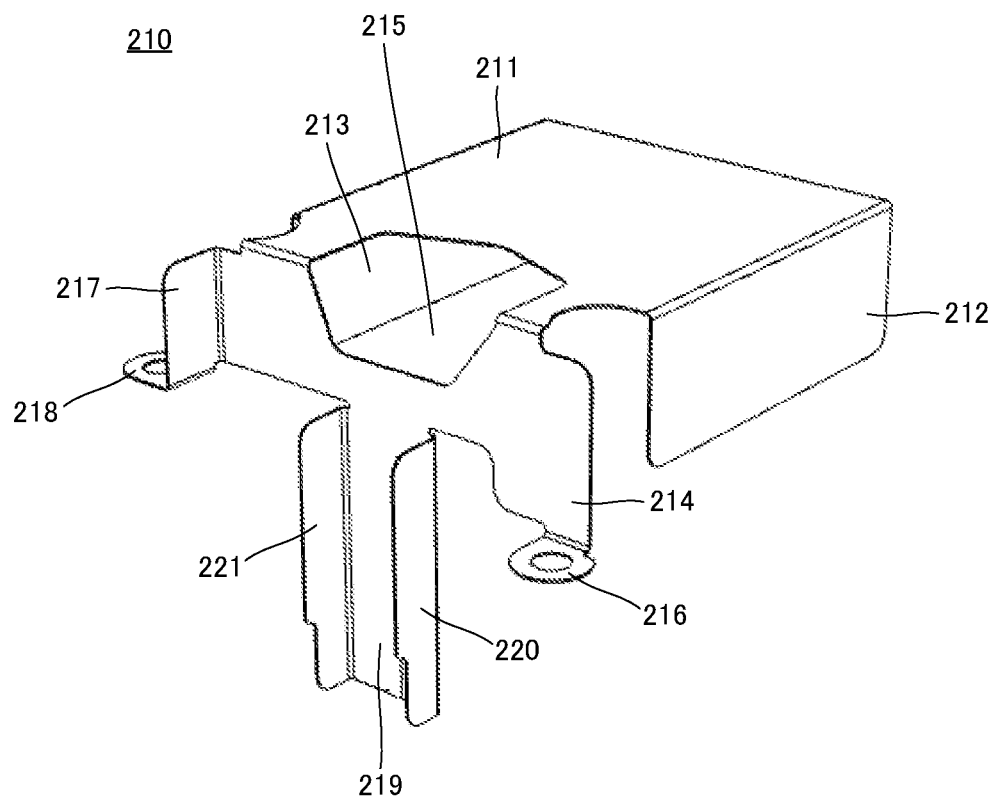
FIG. 4B is a perspective view illustrating a configuration of a transformer shield according to the embodiment.

Transformer shield 210 is provided to cover the −Z-side surface of transformer 24b. Hereinafter, transformer shield 210 will be described in detail with reference to FIG. 4B. FIG. 4B is a perspective view illustrating the configuration of transformer shield 210.

Transformer shield 210 is a thin-plate member (for example, an aluminum member) exhibiting fine conductivity and thermal conductivity. Transformer shield 210 includes bottom wall part 211 extended on the XY plane, first sidewall part 212 extended in the +Z-direction from an end portion of bottom wall part 211 in the +Y-direction, and second sidewall part 213 extended in the +Z-direction from an end portion of bottom wall part 211 in the −Y-direction.

Further, transformer shield 210 has third sidewall part 214 extended in the +Z-direction from the end portion of bottom wall part 211 in the −X-direction. Opening part 215 is provided from the end portion of bottom wall part 211 in the −X-direction over the end portion of third sidewall part 214 in the −Z-direction.

First fixing part 216 is projected toward the −X-direction from the end portion of third sidewall part 214 in the +Z-direction closer to the end portion thereof in the +Y-direction. Transformer shield 210 is fixed to transformer case 200 and partition member 101 at first fixing part 216 (see FIG. 4A).

Fourth sidewall part 217 extended in the −X-direction is provided in the end portion of third sidewall part 214 in the −Y-direction. Second fixing part 218 is projected toward the −Y-direction from the end portion of fourth sidewall part 217 in the +Z-direction. Transformer shield 210 is fixed to transformer case 200 and partition member 101 at second fixing part 218 (see FIG. 4A).

Third sidewall part 214 has intermediate part 219 extended in the +Z-direction. Fifth sidewall part 220 is projected toward the −X-direction from an end portion of intermediate part 219 in the +Y-direction. Further, sixth sidewall part 221 is projected toward the −X-direction from an end portion of intermediate part 219 in the −Y-direction.

As illustrated in FIG. 2 and FIG. 4A, hole 105 opened through the Z-direction is provided in partition member 101 for inserting power line 140 (for example, a litz wire) and signal line 150, and intermediate part 219, fifth sidewall part 220, and sixth sidewall part 221 of transformer shield 210 are inserted into hole 105.

Figure 4C:
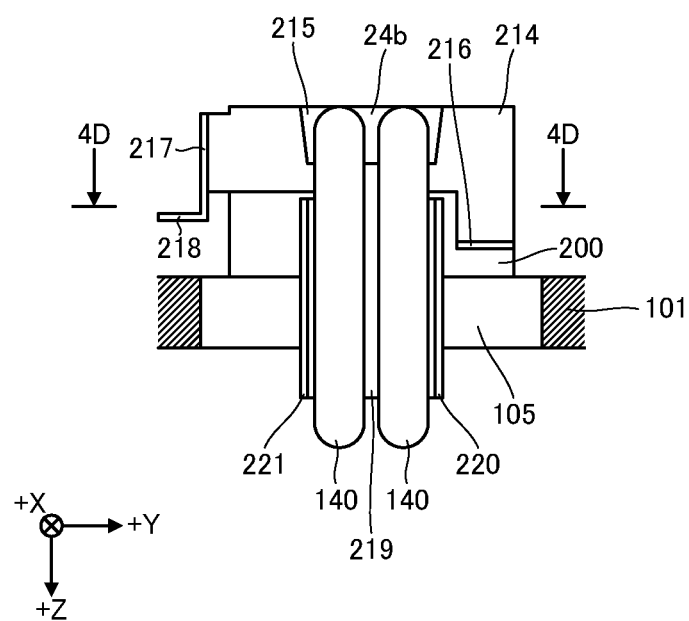
FIG. 4C is a diagram illustrating the transformer.
Figure 4D:
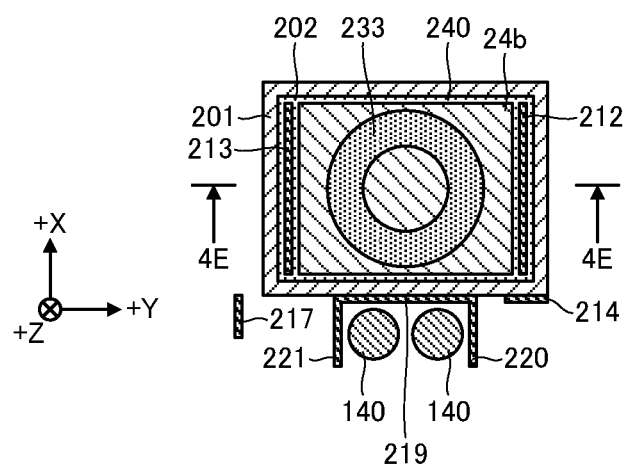
FIG. 4D is a sectional view taken along line 4D-4D in FIG. 4C.
Figure 4E:
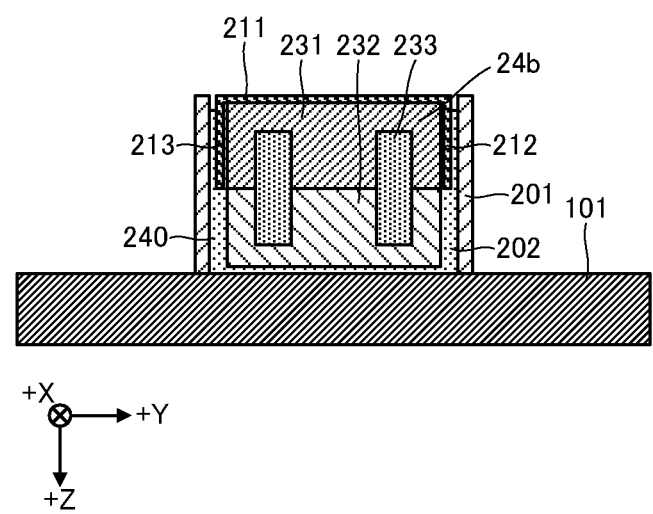
FIG. 4E is a sectional view taken along line 4E-4E in FIG. 4D.

Transformer 24b, transformer case 200, and transformer shield 210 will be described in detail with reference to FIG. 4C, FIG. 4D, and FIG. 4E. FIG. 4C is a diagram illustrating a state where intermediate part 219, fifth sidewall part 220, and sixth sidewall part 221 of transformer shield 210 are inserted into hole 105 of partition member 101. FIG. 4C is the diagram viewing transformer 24b from the −X-direction side with respect to power lines 140 toward the +X-direction. FIG. 4D is a sectional view taken along line 4D-4D in FIG. 4C. FIG. 4E is a sectional view taken along line 4E-4E in FIG. 4D.

As illustrated in FIG. 4A and FIG. 4C, power lines 140 have first end portions thereof connected to the end portions of transformer 24b in the −X-direction and the −Z-direction, and are inserted into opening part 215 to be extended toward the −X-direction and further to the +Z-direction.

Power lines 140 are surrounded by intermediate part 219, fifth sidewall part 220, and sixth sidewall part 221 of transformer shield 210. Intermediate part 219, fifth sidewall part 220, and sixth sidewall part 221 of transformer shield 210 are extended in the +Z-direction along power lines 140.

Although not illustrated in FIG. 4A and FIG. 4C, signal lines 150 electrically connecting first controller 70 with switching element 22b and inverter 24a are inserted into hole 105 on the +Y-direction side of fifth sidewall part 220 and on the −Y-direction side of sixth sidewall part 221. In other words, in the embodiment, there are two signal lines 150, one of which is disposed on the +Y-direction side of fifth sidewall part 220 while the other is disposed on the −Y-direction side of sixth sidewall part 221 and inserted through hole 105.

As described, through having transformer shield 210 (specifically fifth sidewall part 220 or sixth sidewall part 221) exhibiting conductivity interposed between power lines 140 and signal lines 150, it is possible to appropriately suppress the noise generated in power lines 140 interfering with signal lines 150. Therefore, the noise interfering with signal lines 150 due to power lines 140 can be appropriately suppressed without providing a shield (coating) on power lines 140 themselves for preventing leakage of the noise.

As illustrated in FIG. 4D and FIG. 4E, transformer 24b is disposed inside space 202 surrounded by sidewall 201 of transformer case 200. A gap is provided between transformer 24b and sidewall 201 of transformer case 200 and between transformer 24b and partition member 101, respectively. Heat dissipation resin (for example, a potting resin member) 240 is filled in the gaps.

As illustrated in FIG. 4E, transformer 24b is formed by coupling a pair of upper core 231 having E-like sectional shape and lower core 232 having E-like sectional shape, and coil 233 is wound around middle legs of each of upper core 231 and lower core 232. Note that a bobbin (not illustrated) made of an insulation material is disposed around the periphery of coil 233.

As described above, heat dissipation resin 240 is filled in the gap between an end surface of lower core 232 in the +Z-direction and partition member 101. In this way, heat generated in coil 233 can be transmitted to partition member 101 via lower core 232 and heat dissipation resin 240. Therefore, transformer 24b can be cooled appropriately.

Further, the end surface of upper core 231 in the −Z-direction is in contact with bottom wall part 211 of transformer shield 210. First sidewall part 212 extended in the +Z-direction from the end portion in the +Y-direction of bottom wall part 211 of transformer shield 210 and second sidewall part 213 extended in the +Z-direction from the end portion in the −Y-direction of bottom wall part 211 are embedded in heat dissipation resin 240 filled in the gap between sidewall 201 of transformer case 200 and transformer 24b.

In this way, the heat generated in coil 233 can be transmitted to partition member 101 via upper core 231, transformer shield 210 (specifically bottom wall part 211, first sidewall part 212, and second sidewall part 213), and heat dissipation resin 240. Therefore, transformer 24b can be cooled appropriately.

Note that transformer shield 210 (specifically first sidewall part 212 and second sidewall part 213) is configured such that it does not come into contact with a bottom surface (end surface in the +Z-direction) of lower core 232 and transformer case 200 (sidewall 201). In this way, as illustrated in FIG. 4E, transformer shield 210 can be easily placed over upper core 231 from the −Z-direction side with respect to upper core 231 toward +Z-direction (from upper side toward lower side).

As described above, the embodiment includes power lines 140 with the first end portions being connected to transformer 24b, and transformer shield 210 having intermediate part 219, fifth sidewall part 220, and sixth sidewall part 221 extended along power lines 140.

This makes it possible to prevent the noise of power lines 140 from interfering with other power lines without providing a shield to power lines 140 for preventing leakage of the noise. Therefore, it is possible to suppress increase in the size of power lines 140, so that the size of power supply apparatus 1 can be reduced.

Especially, through configuring transformer shield 210 with a member exhibiting fine conductivity and fine thermal conductivity, shielding of the noise of power lines 140 and dissipation of the heat of transformer 24b can both be achieved by transformer shield 210 alone. This makes it possible to reduce the fixing parts (fixing points) compared to the case of separately configuring the member for shielding the noise of power lines 140 and the member for dissipating the heat of transformer 24b.

In the embodiment, transformer 24b is stored within first space 102 on the high-voltage side, and secondary-side rectifier circuit 24c is stored within second space 103 on the low-voltage side. Further, power lines 140 connecting transformer 24b with secondary-side rectifier circuit 24c, and transformer shield 210 are inserted into hole 105 of partition member 101. Therefore, hole 105 can be formed small, and the first space and the second space can be sectioned appropriately.

In the embodiment, transformer 24b is formed integrally to the pedestal of high-voltage board 120 and is stored within transformer case 200 that is open at the end portion in the +Z-direction, and the gap between transformer 24b and transformer case 200 is filled with heat dissipation resin 240. In other words, heat dissipation resin 240 is directly in contact with partition member 101. Therefore, the heat generated in transformer 24b can be transmitted to partition member 101 via heat dissipation resin 240 so that transformer 24b can be cooled appropriately.

In the embodiment, transformer 24b includes upper core 231, lower core 232, and coil 233 surrounded by upper core 231 and lower core 232. Further, the +Z-side surface of lower core 232 is directly in contact with partition member 101. Therefore, the heat generated in coil 233 can be transmitted to partition member 101 via lower core 232.

Further, bottom wall part 211 of transformer shield 210 is directly in contact with the −Z-side surface of upper core 231, and first sidewall part 212 and second sidewall part 213 provided in the end portions of bottom wall part 211 in the +Y-direction and the −Y-direction are embedded in heat dissipation resin 240. Therefore, the heat generated in coil 233 can be transmitted to partition member 101 via upper core 231, transformer shield 210, and heat dissipation resin 240. In this way, it is possible with the embodiment to cool transformer 24b appropriately.

While the case where power lines 140 and transformer shield 210 are inserted into hole 105 of partition member 101 is described in the embodiment above, the configuration is not limited to such case. Even when the transformer and the secondary-side rectifier circuit are stored within a same space, it is possible to appropriately prevent the noise of the power lines connecting the transformer with the secondary-side rectifier circuit from interfering with other power lines through disposing a shield member to surround the power lines connecting the transformer with the secondary-side rectifier circuit.

Further even when the transformer and the secondary-side rectifier circuit are mounted on a same board and the transformer and the secondary-side rectifier circuit are connected by a wiring pattern, it is possible to appropriately prevent the noise of the wiring pattern connecting the transformer with the secondary-side rectifier circuit from interfering with other power lines through disposing a shield member to surround the surface of the wiring pattern connecting the transformer with the secondary-side rectifier circuit.

Further, while the case of the power lines connecting the transformer with the secondary-side rectifier circuit is described in the embodiment above, it is to be noted that the embodiment is not limited to such case and can naturally be applied to power lines electrically connecting elements of the power conversion apparatus.

(Shared Structure of Smoothing Capacitor)

Figure 5A:
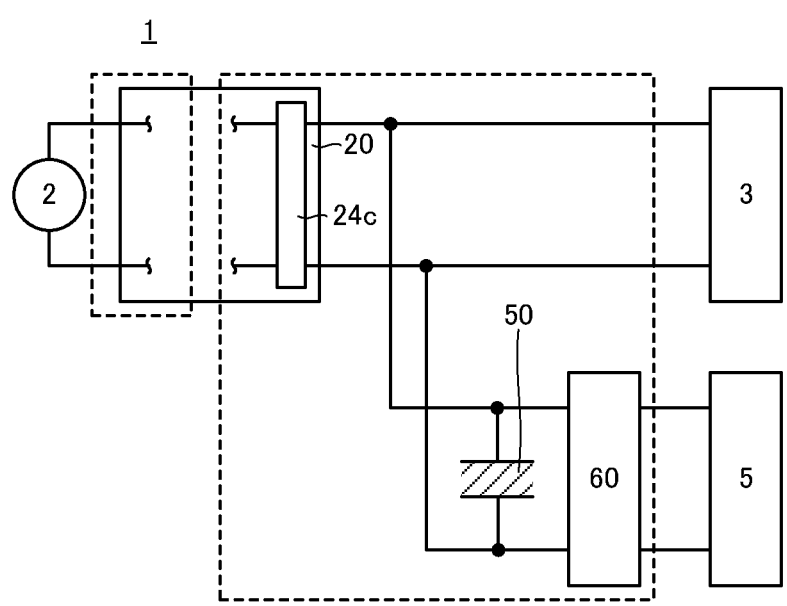
FIG. 5A is a diagram for describing a shared structure of a capacitor.
Figure 5B:
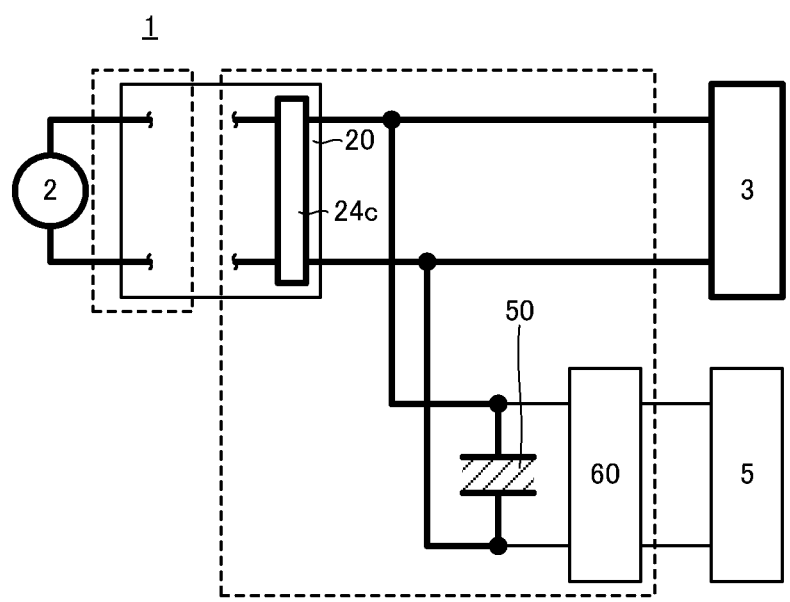
FIG. 5B is a diagram for describing a shared structure of the capacitor.
Figure 5C:
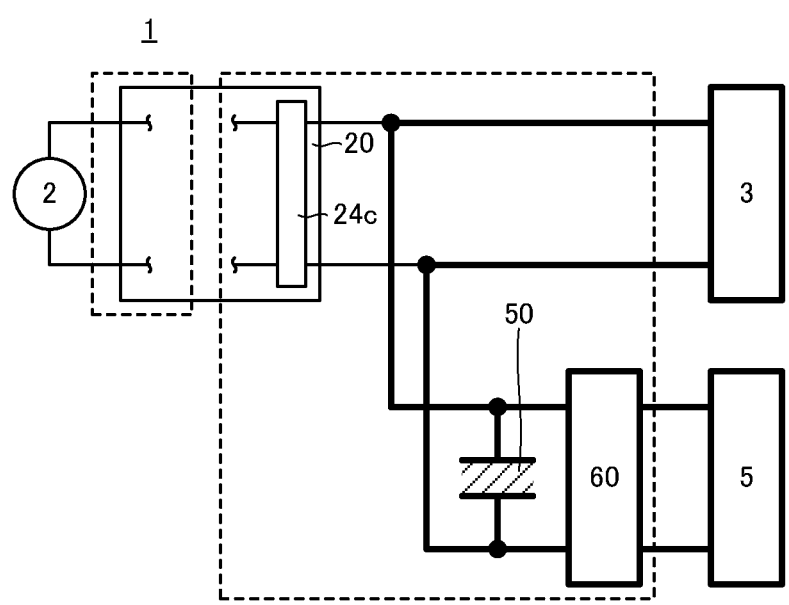
FIG. 5C is a diagram for describing a shared structure of the capacitor.

Functions of capacitor 50 will be described with reference to FIG. 5A, FIG. 5B, and FIG. 5C. FIG. 5A, FIG. 5B, and FIG. 5C are circuit block diagrams illustrating the configuration of power supply apparatus 1. Note that components not directly related to explanations are omitted in FIG. 5A, FIG. 5B, and FIG. 5C.

As described above, elements other than secondary-side rectifier circuit 24c of charger 20 are included in first circuit part 6 where a high voltage is applied, and are disposed within first space 102.

Meanwhile, secondary-side rectifier circuit 24c of charger 20, capacitor 50, and power converter 60 are all included in second circuit part 7 where a low voltage is applied.

As described above, the insulation class of first space 102 for storing first circuit part 6 and the insulation class of second space 103 for storing second circuit part 7 are different from each other. Specifically, the insulation class of first space 102 is higher than the insulation class of second space 103.

Secondary-side rectifier circuit 24c of charger 20, capacitor 50, and power converter 60 are all mounted on low-voltage board 130 within second space 103, and are adjacently disposed with each other.

Capacitor 50 is provided on the power line that electrically connects secondary-side rectifier circuit 24c of charger 20 and battery 3. Capacitor 50 is provided on the input side of power converter 60.

In power supply apparatus 1, an operation for charging the power from external power supply 2 to battery 3 and an operation for driving motor 5 by using the power of battery 3 are mutually exclusive. In other words, charger 20 and power converter 60 do not operate simultaneously.

FIG. 5B illustrates the operation state when charging the power from external power supply 2 to battery 3. When charging the power from external power supply 2 to battery 3, the power from secondary-side rectifier circuit 24c of charger 20 is smoothened by capacitor 50 to be output to battery 3.

FIG. 5C illustrates the operation state when driving motor 5 with the power from battery 3. When driving motor 5 with the power from battery 3, the power from battery 3 is smoothened by capacitor 50 to be input to power converter 60.

As described above, when charging the power from external power supply 2 to battery 3 with the embodiment, capacitor 50 can be used as a smoothing capacitor on the output side of secondary-side rectifier circuit 24c of charger 20. Further, when driving motor 5 with the power from battery 3, capacitor 50 can be used as a smoothing capacitor on the input side of power converter 60.

Therefore, capacitor 50 can be used in common as the smoothing capacitor on the output side of secondary-side rectifier circuit 24c of charger 20 and the smoothing capacitor on the input side of power converter 60, so that the space for disposing the smoothing capacitors can be reduced.

Further, with the embodiment, the capacitance of capacitor 50 is smaller than the total of the capacitance required for smoothing the power from secondary-side rectifier circuit 24c of charger 20 and the capacitance required for smoothing the power for power converter 60.

Specifically, the capacitance of capacitor 50 can be defined as the larger capacitance out of the capacitance required for smoothing the power from secondary-side rectifier circuit 24c of charger 20 and the capacitance required for smoothing the power for power converter 60. In this way, the capacitance of capacitor 50 can be defined as the minimum necessary capacitance.

Further, capacitor 50 is provided in second circuit part 7 where a low voltage is applied, so that it is possible to preferably suppress having excessive pressure strength.

Further, in the embodiment, secondary-side rectifier circuit 24c of charger 20, capacitor 50, and power converter 60 are all disposed within second space 103. Therefore, the wiring from secondary-side rectifier circuit 24c of charger 20 to capacitor 50 and the wiring from capacitor 50 to power converter 60 can be shortened.

This makes it possible to satisfy the functions as the smoothing capacitor on the output side of secondary-side rectifier circuit 24c of charger 20 and as the smoothing capacitor on the input side of power converter 60 by using a capacitor of a relatively small capacitance as capacitor 50.

Especially, in the embodiment, secondary-side rectifier circuit 24c of charger 20, capacitor 50, and power converter 60 are all mounted on low-voltage board 130. In this way, secondary-side rectifier circuit 24c of charger 20, capacitor 50, and power converter 60 can be adjacently disposed with each other. Therefore, the wiring from secondary-side rectifier circuit 24c of charger 20 to capacitor 50 and the wiring from capacitor 50 to power converter 60 can be shortened further.

While the case of mounting capacitor 50 on low-voltage board 130 is described in the embodiment above, the configuration is not limited to such case. Capacitor 50 may also be mounted on a board different from low-voltage board 130. Further, secondary-side rectifier circuit 24c of charger 20, capacitor 50, and power converter 60 may also be mounted on a board different from low-voltage board 130.

(Coil of DC/DC Converter and Peripheral Configurations Thereof)

Figure 6A:
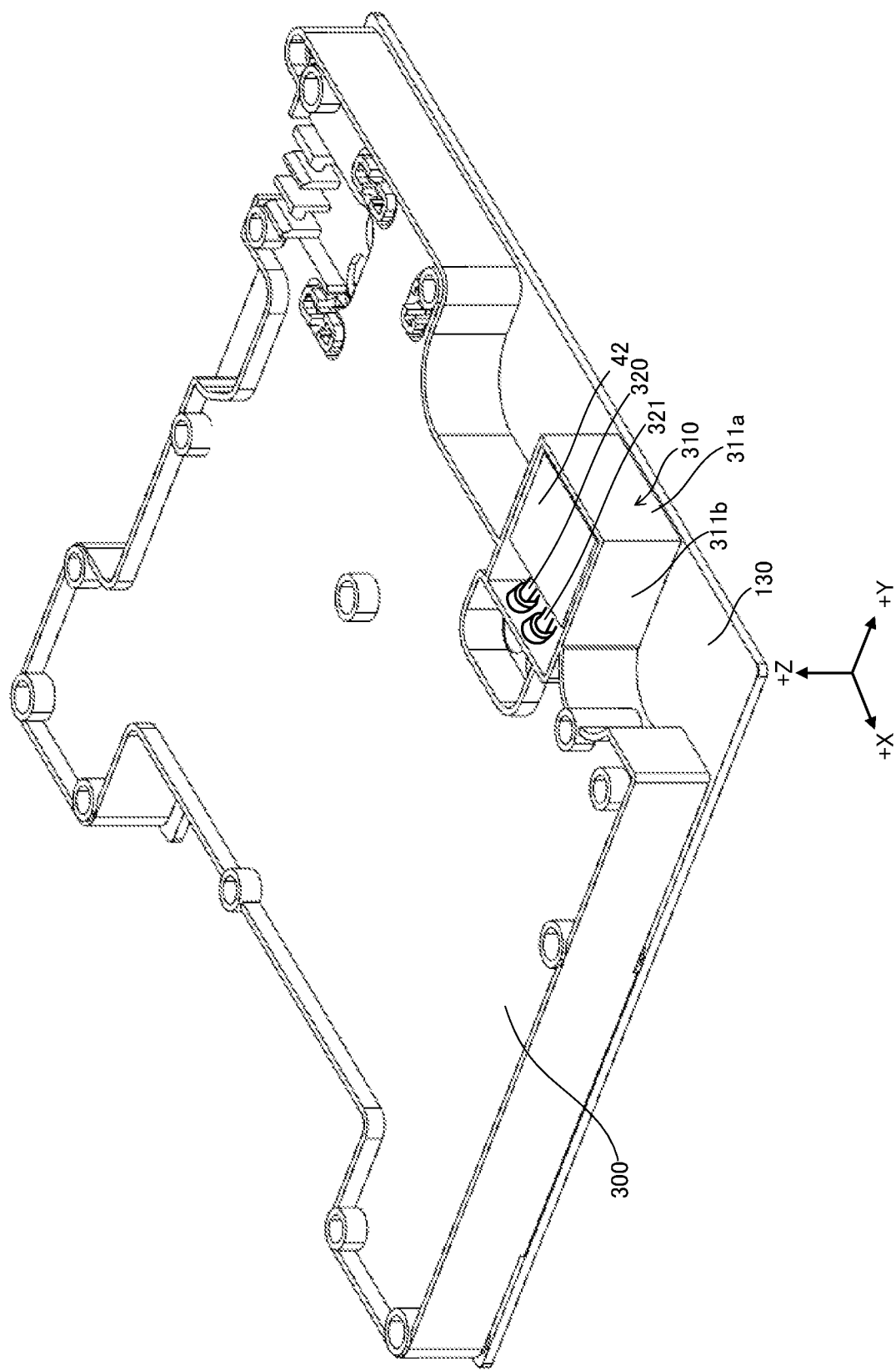
FIG. 6A is a perspective view illustrating a coil of a DC/DC converter according to the embodiment and peripheral configuration thereof.
Figure 6B:
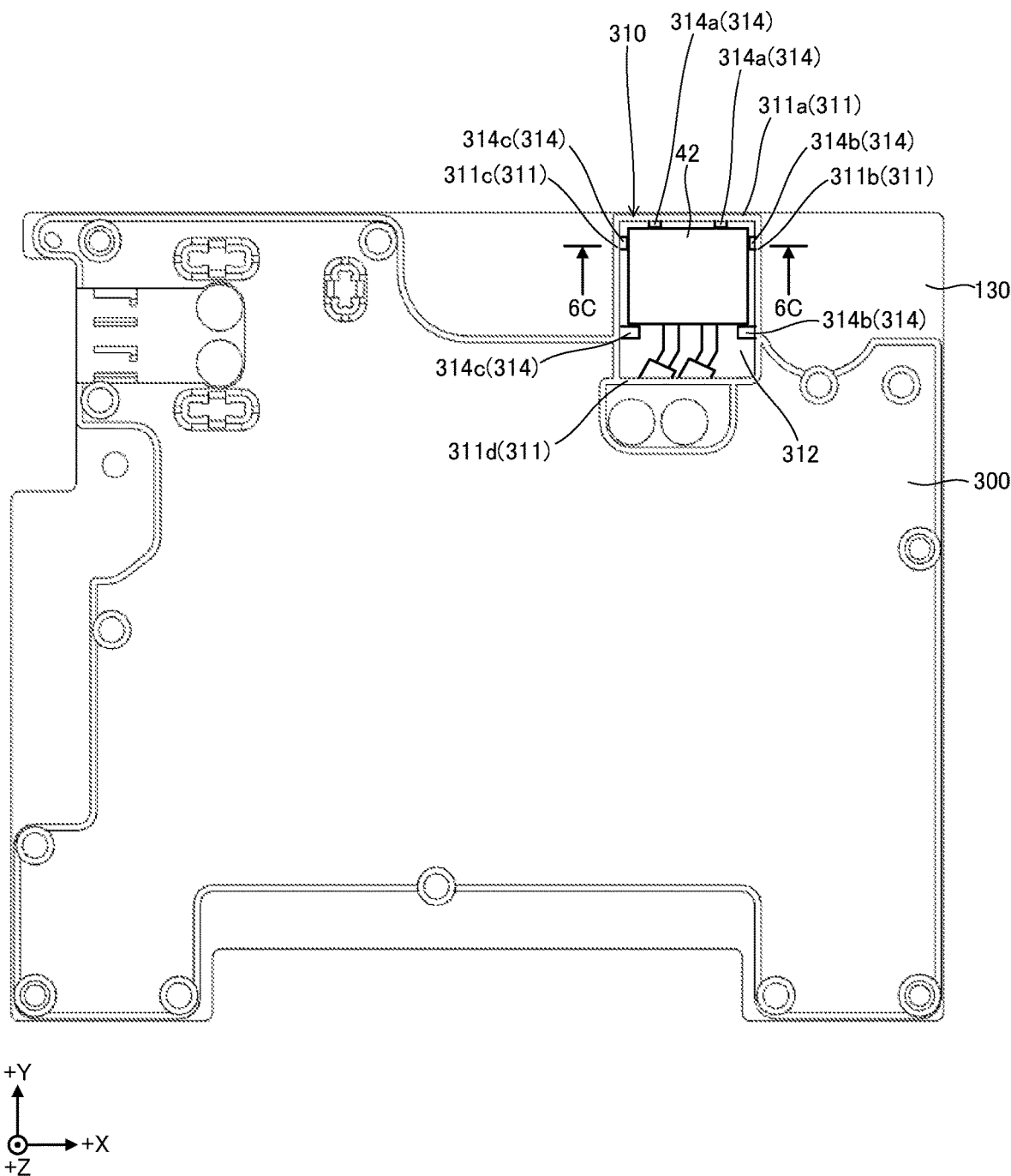
FIG. 6B is a diagram illustrating the coil.
Figure 6C:
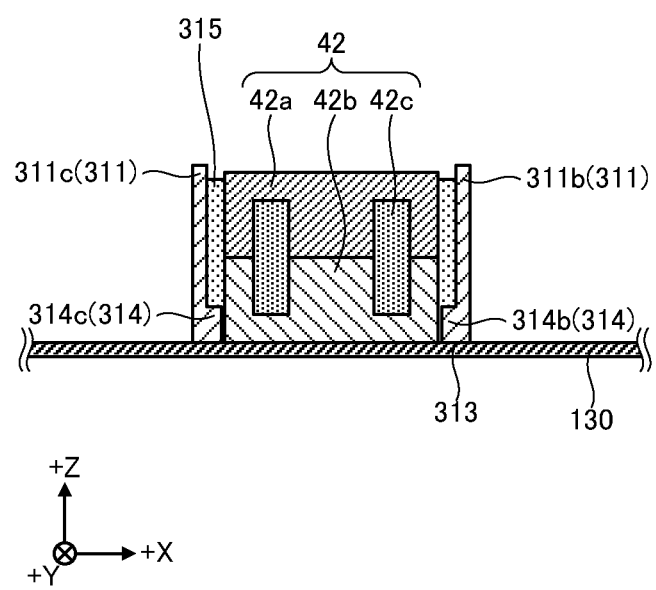
FIG. 6C is a sectional view taken along line 6C-6C in FIG. 6B.

Coil 42 of DC/DC converter 40 and peripheral configurations thereof will be described with reference to FIG. 6A, FIG. 6B, and FIG. 6C. FIG. 6A is a perspective view illustrating coil 42 and the peripheral configurations thereof. FIG. 6B is a diagram when viewed from the +Z-direction side with respect to coil 42 toward the −Z-direction. FIG. 6C is a sectional view taken along line 6C-6C in FIG. 6B. In FIG. 6A to FIG. 6C, X-axis, Y-axis, and Z-axis are drawn for the sake of convenience. The X-axis, the Y-axis, and the Z-axis are common to those drawn in FIG. 4A to FIG. 4E. Note that components not directly related to explanations are omitted in FIG. 6A to FIG. 6C.

As illustrated in FIG. 6A and FIG. 6B, pedestal 300 of control board 160 (see FIG. 2) is disposed on the +Z-side surface of low-voltage board 130. As described above, the resin insulation layer is coated on the +Z-side surface of low-voltage board 130.

Case 310 for storing coil 42 is provided by being projected toward the +Y-direction from pedestal 300 while being integrally formed with pedestal 300. Pedestal 300 and case 310 are both made of resin.

On pedestal 300, control board 160 (see FIG. 2) where various kinds of semiconductor components constituting first controller 70 (see FIG. 2) and various kinds of semiconductor components constituting second controller 80 (see FIG. 2) are installed.

Note here that a positioning guide hole is provided in pedestal 300 and in low-voltage board 130. Further, a positioning pin (not illustrated) is inserted into both the guide hole of pedestal 300 and the guide hole of low-voltage board 130. In this way, pedestal 300 is positioned with respect to low-voltage board 130.

Further, a positioning guide hole is provided also in control board 160 and in partition member 101. Through inserting the above-described positioning pin also into those holes, partition member 101, low-voltage board 130, pedestal 300, and control board 160 are positioned.

Note that it may not be limited to the configuration where a single positioning pin is inserted into all the guide holes of each of partition member 101, low-voltage board 130, pedestal 300, and control board 160. For example, a first positioning pin may be inserted into the guide hole of pedestal 300 and the guide hole of control board 160 to position pedestal 300 with respect to control board 160 and a second positioning pin may be inserted into the guide hole of control board 160 and the guide hole of low-voltage board 130 to position control board 160 with respect to low-voltage board 130. In other words, pedestal 300 may be positioned with respect to low-voltage board 130 via control board 160.

The end portions of case 310 both in the −Z-direction and the +Z-direction are opened. Case 310 includes sidewalls 311 (first sidewall 311a, second sidewall 311b, third sidewall 311c, and fourth sidewall 311d). Space 312 surrounded by those sidewalls is formed with first sidewall 311a, second sidewall 311b, third sidewall 311c, and fourth sidewall 311d.

As illustrated in FIG. 6C, bottom surface 313 that is the −Z-side surface of sidewalls 311 is in contact with low-voltage board 130. Bottom surface 313 is bonded with low-voltage board 130 by an adhesive. On the end portion side of first sidewall 311a, second sidewall 311b, and third sidewall 311c in the −Z-direction, ribs 314 (first rib 314a, second rib 314b, and third rib 314c) projecting toward space 312 are formed.

Coil 42 is disposed inside space 312, and positioned with respect to case 310. More specifically, coil 42 has its four sides guided by first rib 314a, second rib 314b, and third rib 314c and positioned with respect to case 310.

With the above-described configuration, coil 42 is positioned with respect to low-voltage board 130 via case 310, pedestal 300, and control board 160.

Heat dissipation resin 315 is filled in a gap between coil 42 and sidewalls 311 of case 310. Coil 42 includes upper core 42a, lower core 42b, and coil main body 42c surrounded by upper core 42a and lower core 42b.

The −Z-side surface of lower core 42b is directly in contact with low-voltage board 130. Therefore, heat generated in coil main body 42c is transmitted to lower core 42b and further to low-voltage board 130 that is directly in contact with lower core 42b.

Further, the heat generated in coil main body 42c is transmitted to upper core 42a and transmitted further to low-voltage board 130 via heat dissipation resin 315. Therefore, coil 42 can be cooled appropriately.

As illustrated in FIG. 6A and FIG. 6B, power line 320 and power line 321 are extended from an end portion of coil 42 in the −Y-direction toward the −Y-direction. In other words, each of a first end portion of power line 320 and a first end portion of power line 321 is connected to coil 42. Power line 320 and power line 321 are embedded in heat dissipation resin 315. Not both of power line 320 and power line 321 may be embedded in heat dissipation resin 315 but only one of power line 320 and power line 321 may be embedded in heat dissipation resin 315.

As described above, the embodiment includes: pedestal 300 that is fixed to low-voltage board 130 and has control board 160 installed thereon; and case 310 that is provided integrally with pedestal 300, and has sidewalls 311 surrounding coil 42 while being in contact with low-voltage board 130. Pedestal 300 is positioned with respect to low-voltage board 130, and coil 42 is positioned with respect to case 310.

Therefore, coil 42 can be positioned with respect to low-voltage board 130 without providing a mechanism for positioning coil 42 and low-voltage board 130.

In the embodiment, coil 42 is directly in contact with low-voltage board 130. Specifically, the −Z-side surface of lower core 42b of coil 42 is directly in contact with the insulation layer coated on the +Z-side surface of low-voltage board 130. In this way, the heat generated in coil 42 can be transmitted to low-voltage board 130 while securing insulation between coil 42 and low-voltage board 130. Therefore, coil 42 can be cooled appropriately.

In the embodiment, heat dissipation resin 315 is filled in the gap between coil 42 and sidewalls 311 of case 310. Therefore, the heat generated in coil 42 can be transmitted to low-voltage board 130 via heat dissipation resin 315. Therefore, coil 42 can be cooled appropriately.

In the embodiment, pedestal 300 is positioned with respect to low-voltage board 130. Especially, in a case of providing a positioning pin in pedestal 300, control board 160 and low-voltage board 130 can be positioned by pedestal 300. Therefore, it is possible to decrease positioning error between control board 160 and low-voltage board 130.

In the embodiment, ribs 314 that are projected toward coil 42 and in contact with coil 42 for positioning coil 42 are provided to sidewalls 311 of case 310. Therefore, it is possible to appropriately position coil 42 with respect to case 310 with a simple configuration where ribs 314 are provided to sidewalls 311.

In the embodiment, at least one of power lines 320 and 321 with the first end portions thereof connected to coil 42 is embedded in heat dissipation resin 315. Therefore, the heat dissipation property for the heat generated at least one of power lines 320 and 321 can be increased, and at least one of power lines 320 and 321 can be fixed.

(Current Sensor and Peripheral Configurations Thereof)

Current sensor 90 and peripheral configurations thereof will be described with reference to FIG. 7A, FIG. 7B, FIG. 7C, and FIG. 7D. In FIG. 7A to FIG. 7D, X-axis, Y-axis, and Z-axis are drawn for the sake of convenience. The X-axis, the Y-axis, and the Z-axis are common to those described above. Note that components not directly related to explanations are omitted in FIG. 7A to FIG. 7D.

Figure 7A:
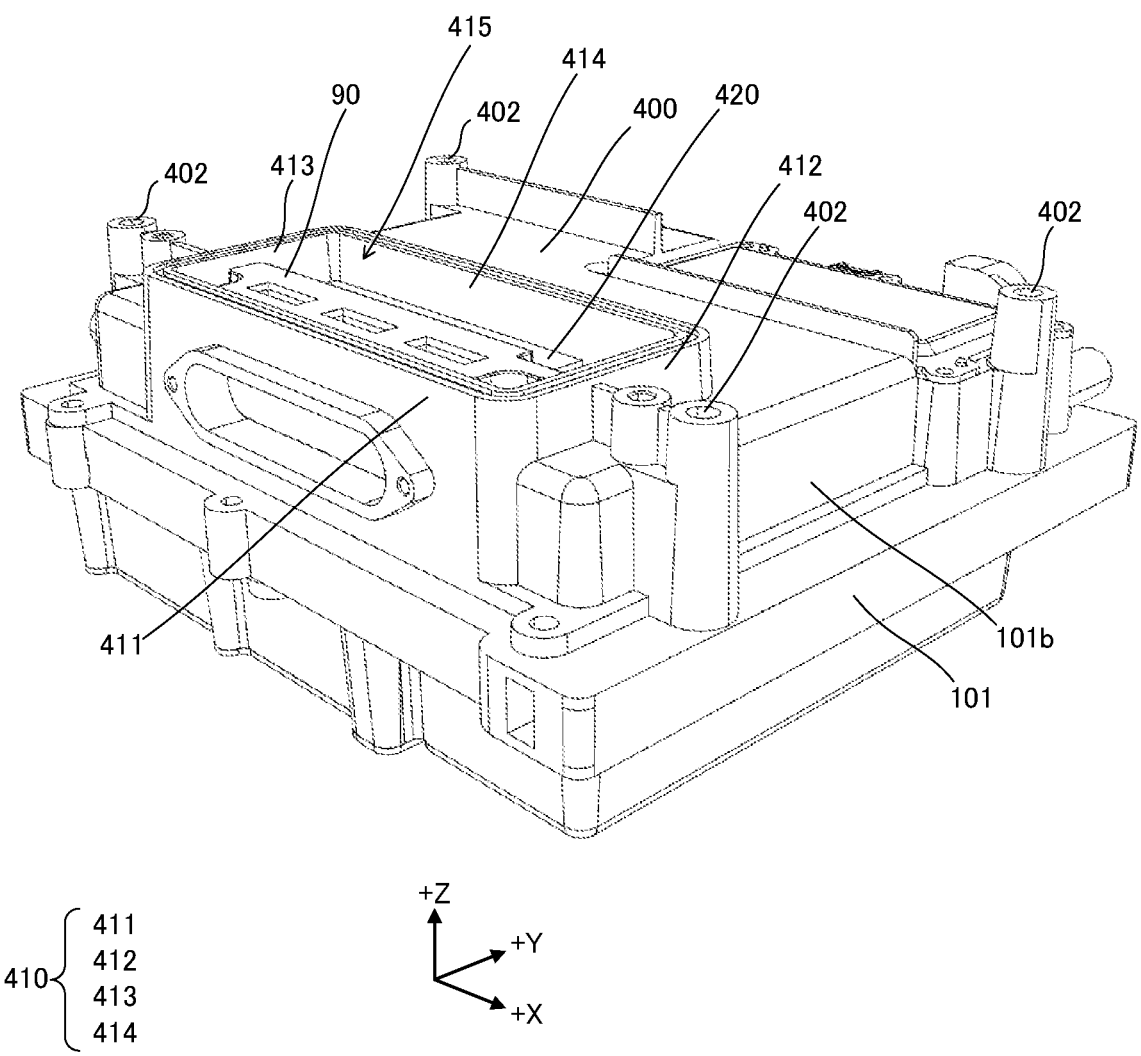
FIG. 7A is a perspective view illustrating a current sensor according to the embodiment and peripheral configuration thereof.
Figure 7B:
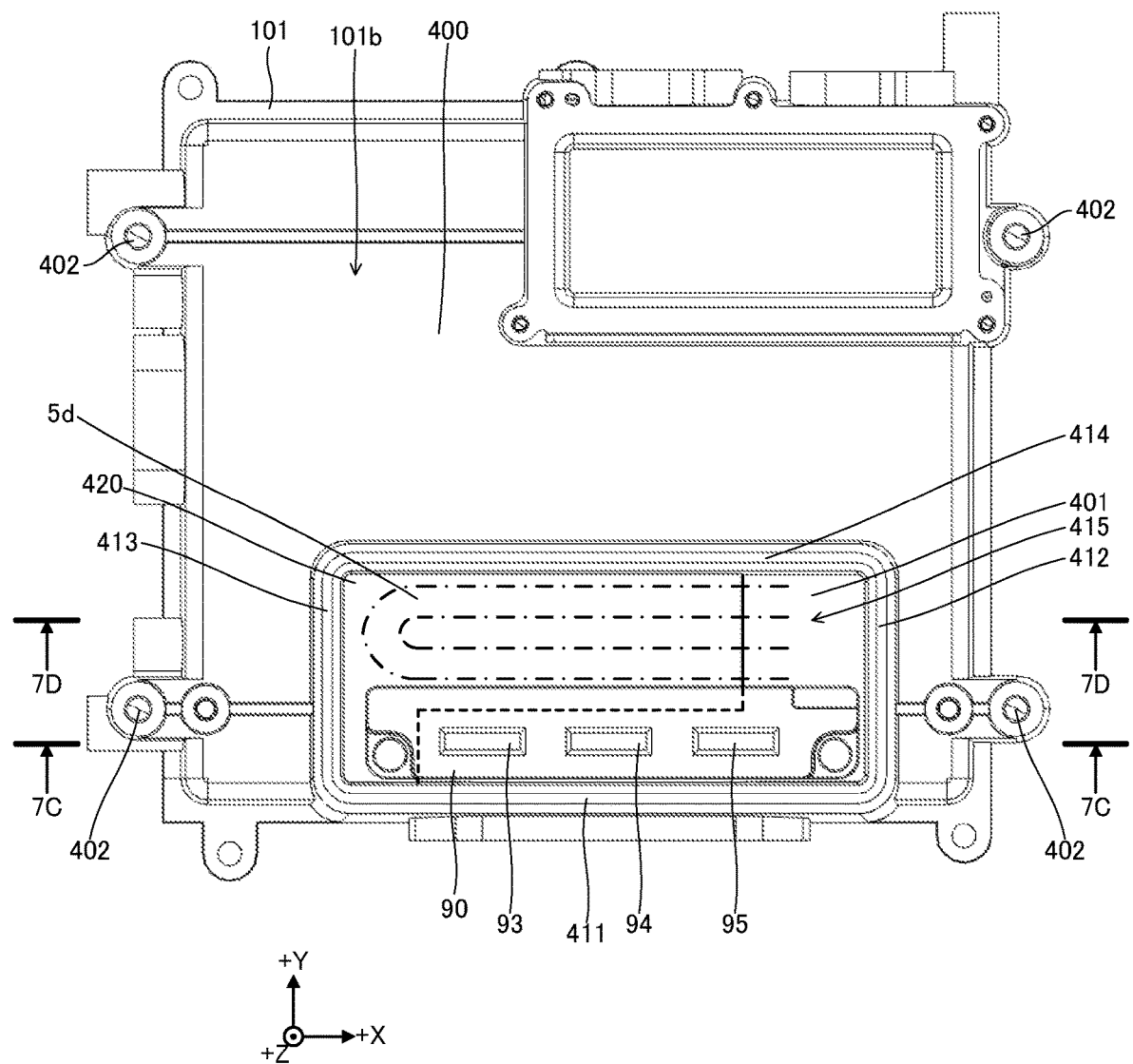
FIG. 7B is a diagram illustrating the current sensor.

FIG. 7A is a perspective view illustrating current sensor 90 and the peripheral configurations thereof. FIG. 7B is a plan view illustrating current sensor 90 and the peripheral configurations thereof. As illustrated in FIG. 7A, second cover member 101b is fixed to the +Z-side surface of partition member 101. Second cover member 101b includes a plurality of fixing parts 402 used for being fixed to motor 5 (see FIG. 2).

As described above, second circuit part 7 of low voltage (see FIG. 2) is stored in second space 103 (see FIG. 2) surrounded by partition member 101 and second cover member 101b.

Second cover member 101b includes wall part 400 extended on the XY plane. Opening part 401 communicating second space 103 with an external space is provided in wall part 400. Wall parts 410 are projected from wall part 400 toward the +Z-direction. In other words, wall parts 410 are projected from wall part 400 toward the external space.

Wall parts 410 include: first wall part 411 extended in the X-direction; second wall part 412 extended from an end portion of first wall part 411 in the +X-direction toward the +Y-direction; third wall part 413 extended from an end portion of first wall part 411 in the −X-direction toward the +Y-direction; and fourth wall part 414 connecting an end portion of second wall part 412 in the +Y-direction with an end portion of third wall part 413 in the +Y-direction.

Wall part 420 extended on the XY plane is provided in third space 415 surrounded by wall parts 410 (first wall part 411, second wall part 412, third wall part 413, and fourth wall part 414). Wall part 420 is formed integrally with wall part 400 and wall parts 410. Note that wall part 420 may be formed as a separate member from wall part 400 and wall parts 410 and fixed to second cover member 101b.

Current sensor 90 is fixed to the +Z-side surface of wall part 420. As described above, current sensor 90 is a sensor that detects electric current values of the power output from power converter 60 and supplied to motor 5.

Figure 7C:
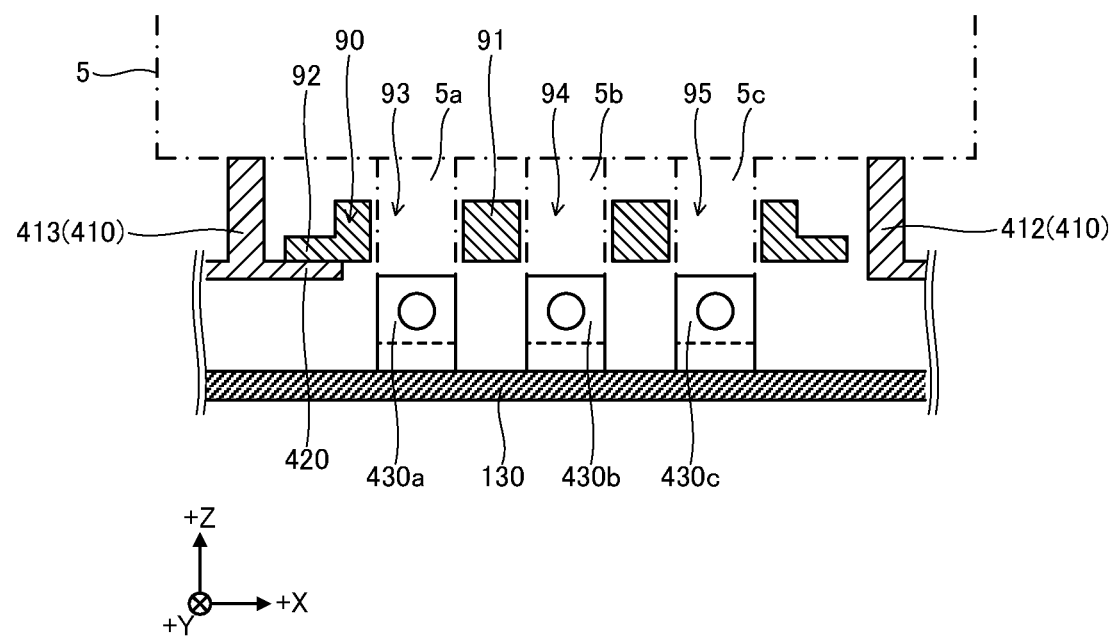
FIG. 7C is a sectional view taken along line 7C-7C in FIG. 7B.

Current sensor 90 will be described in detail with reference also to FIG. 7C. FIG. 7C is a sectional view taken along line 7C-7C in FIG. 7B. Current sensor 90 includes main body part 91, fixing part 92, first hole 93, second hole 94, and third hole 95 opened through main body part 91 in the Z-direction. First hole 93, second hole 94, and third hole 95 are provided in line along the X-direction.

As described above, power converter 60 for supplying the power to motor 5 is mounted on low-voltage board 130. Three-phase AC current output from power converter 60 is output from bus bar 430a, bus bar 430b, and bus bar 430c projected from the +Z-side surface of low-voltage board 130 toward the +Z-direction.

As illustrated in FIG. 7C, motor 5 is placed to be closely fitted with the +Z-side surface of wall parts 410, and fixed to second cover member 101b. An O-ring is disposed on the +Z-side surface of wall parts 410 to tightly seal third space 415 surrounded by wall parts 410.

Bus bar 5a, bus bar 5b, and bus bar 5c are projected from motor 5. Bus bar 5a is inserted into first hole 93. Bus bar 5b is inserted into second hole 94. Bus bar 5c is inserted into third hole 95. Bus bar 5a is fixed to bus bar 430a. Bus bar 5b is fixed to bus bar 430b. Bus bar 5c is fixed to bus bar 430c.

Current sensor 90 is fixed to the +Z-side surface of wall part 420, so that the distance between current sensor 90 and low-voltage board 130 can be secured. In this way, it is possible to preferably prevent the noise generated in the circuit mounted on low-voltage board 130 from influencing on current sensor 90. Therefore, fine accuracy of current sensor 90 can be secured.

Figure 7D:
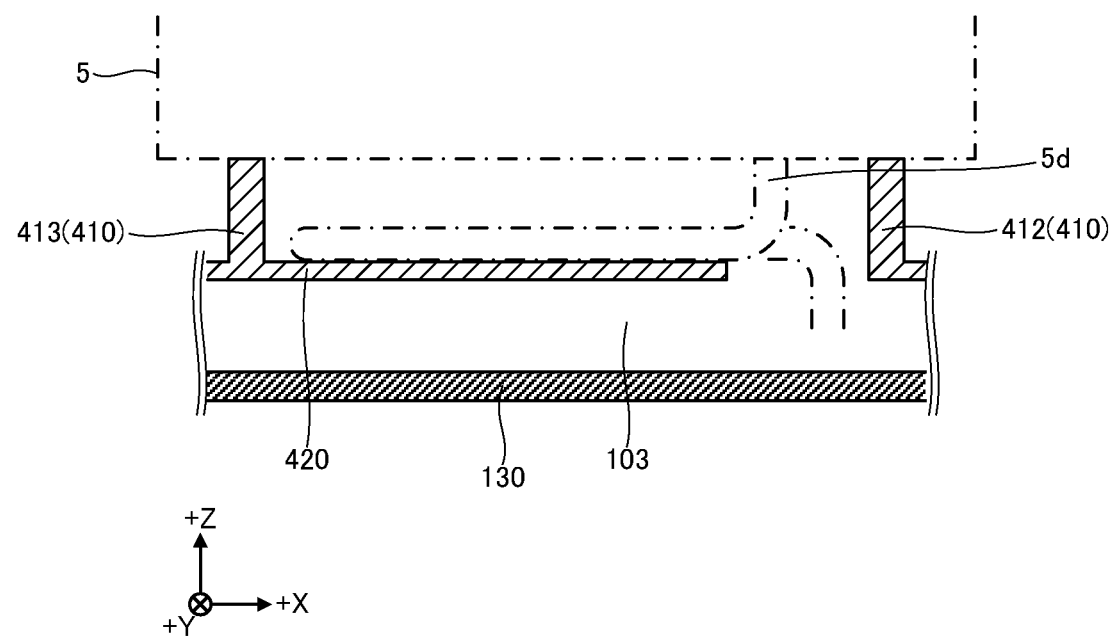
FIG. 7D is a sectional view taken along line 7D-7D in FIG. 7B.

Routing of wiring will be described with reference to FIG. 7D. FIG. 7D is a sectional view taken along line 7D-7D in FIG. 7B. As illustrated in FIG. 7D, signal line 5d electrically connecting power supply apparatus 1 with motor 5 is provided. A first end portion of signal line 5d is connected to motor 5, and a second end portion of signal line 5d is connected to power supply apparatus 1.

When fixing power supply apparatus 1 and motor 5 to be integrated, power supply apparatus 1 and motor 5 are fixed in a state where the first end portion of signal line 5d is connected to motor 5 and the second end portion of signal line 5d is connected to power supply apparatus 1. Therefore, relatively long wiring is used as signal line 5d.

In the embodiment, as illustrated in FIG. 7D, signal line 5d for controlling motor 5 is placed on the +Z-side surface of wall part 420 in a state where motor 5 is fixed to power supply apparatus 1. Therefore, it is possible to prevent signal line 5*d* from entering into second space 103 and contacting with other electric components disposed within second space 103.

As described above, in the embodiment, second cover member 101*b* includes: wall part 400 where opening part 401 communicating second space 103 with the external space is provided; and wall parts 410 that are projected from wall part 400 toward the external space and surround opening part 401. Further, current sensor 90 that detects the electric current values of the power output from power converter 60 is disposed within third space 415 surrounded by wall parts 410.

This makes it possible to secure the distance between current sensor 90 and low-voltage board 130. Therefore, it is possible to preferably prevent the noise generated in the circuit mounted on low-voltage board 130 from influencing current sensor 90. In this way, fine accuracy of current sensor 90 can be secured.

In the embodiment, wall part 420 projected from wall parts 410 toward third space 415 and extended on the XY plane is provided, and current sensor 90 is fixed to wall part 420. Therefore, it is possible to prevent current sensor 90 from being shifted.

In the embodiment, current sensor 90 is disposed on the +Z-side surface of wall part 420, that is, on the external space side. Therefore, current sensor 90 can be fixed to wall part 420 from the external space side.

In the embodiment, wall part 420 is a part of second cover member 101*b*, and integrally formed with at least one of wall part 400 and wall parts 410. Therefore, it is possible to suppress fall down of wall part 420.

In the embodiment, signal line 5*d* is placed on wall part 420. Therefore, it is possible to prevent signal line 5*d* from entering into second space 103 and contacting with other electric components disposed within second space 103.

While various embodiments have been described herein above, it is to be appreciated that various changes in form and detail may be made without departing from the spirit and scope of the invention(s) presently or hereafter claimed.

This application is entitled and claims the benefit of Japanese Patent Application No. 2018-193049, filed on Oct. 12, 2018, the disclosure of which including the specification, drawings and abstract is incorporated herein by reference in its entirety.

INDUSTRIAL APPLICABILITY

The power conversion apparatus according to the present disclosure is capable of reducing the size and can be preferably used for electric vehicles (EV).

The invention claimed is:

1. A power conversion apparatus, comprising:
a plurality of power converters including a first power converter, a second power converter, and a third power converter,
wherein the first power converter, in operation, converts a direct current power to an alternating current power,
wherein the second power converter, in operation, converts a first direct current voltage to a second direct current voltage,
wherein the first power converter and the second power converter operate simultaneously by power supplied via a first connector,
wherein the third power converter operates at a timing different from the first power converter; and
a heat dissipation board having a first pattern formed thereon, the first pattern being shared by a power line that couples the power supplied via the first connector to the first power converter, a power line that couples the power supplied via the first connector to the second power converter, and a power line that couples power output from the third power converter to the first connector,
wherein the first power converter and the second power converter are mounted on the heat dissipation board, and
wherein an electric current flowing in the first pattern when the power supplied via the first connector is supplied from the first connector to the first power converter is larger than an electric current flowing in the first pattern when the power output from the third power converter is supplied to the first connector.

2. The power conversion apparatus according to claim 1, wherein a part of the third power converter is mounted on the heat dissipation board.

3. The power conversion apparatus according to claim 2, the power conversion apparatus being installed on a vehicle, wherein:
the first power converter is an inverter that drives a driving motor for driving the vehicle to run by using power of a battery installed on the vehicle;
the second power converter is a DC/DC converter circuit that converts voltage of the power supplied from the battery to a voltage suited for a load installed on the vehicle;
the third power converter is a charger that charges power from a power supply outside the vehicle to the battery;
the charger includes a primary-side circuit on which the voltage of the power from the power supply outside the vehicle is applied, and a secondary-side circuit on which a voltage that is transformed from the voltage of the power from the power supply outside the vehicle is applied; and
the secondary-side circuit is mounted on the heat dissipation board.

4. The power conversion apparatus according to claim 3, further comprising a housing sectioned by a partition member into a first space and a second space, wherein:
the primary-side circuit is stored within the first space; and
the heat dissipation board is stored within the second space.

5. The power conversion apparatus according to claim 1, further comprising:
a plurality of control circuits operated by power supplied via a second connector and controlling the plurality of power converters; and
a control board having a second pattern formed thereon, the second pattern distributing the power supplied via the second connector to the plurality of control circuits.

* * * * *